United States Patent
Matsuda et al.

(10) Patent No.: US 11,257,994 B2
(45) Date of Patent: Feb. 22, 2022

(54) RESIN PACKAGE AND LIGHT EMITTING DEVICE

(71) Applicant: NICHIA CORPORATION, Anan (JP)

(72) Inventors: Kazuya Matsuda, Anan (JP); Yasuo Kato, Anan (JP); Hiroyuki Tanaka, Tokushima (JP)

(73) Assignee: NICHIA CORPORATION, Anan (JP)

( * ) Notice: Subject to any disclaimer, the term of this patent is extended or adjusted under 35 U.S.C. 154(b) by 126 days.

(21) Appl. No.: 16/720,681

(22) Filed: Dec. 19, 2019

(65) Prior Publication Data

US 2020/0212274 A1 Jul. 2, 2020

(30) Foreign Application Priority Data

Dec. 26, 2018 (JP) .............................. JP2018-242142

(51) Int. Cl.
| | |
|---|---|
| H01L 33/56 | (2010.01) |
| H01L 33/48 | (2010.01) |
| H01L 33/46 | (2010.01) |
| H01L 33/62 | (2010.01) |

(52) U.S. Cl.
CPC .............. *H01L 33/56* (2013.01); *H01L 33/46* (2013.01); *H01L 33/486* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 2013/0161665 A1* | 6/2013 | Kuwaharada | ........... H01L 33/54 257/88 |
| 2018/0175251 A1 | 6/2018 | Naka et al. | |
| 2018/0175252 A1 | 6/2018 | Naka | |
| 2018/0226544 A1 | 8/2018 | Isono et al. | |

FOREIGN PATENT DOCUMENTS

| | | |
|---|---|---|
| JP | 2007-149823 A | 6/2007 |
| JP | 2012-079790 A | 4/2012 |
| JP | 2012-129458 A | 7/2012 |
| JP | 2012-160580 A | 8/2012 |
| JP | 2012-160581 A | 8/2012 |
| JP | 2018-098458 A | 6/2018 |
| JP | 2018-098459 A | 6/2018 |
| JP | 2018-125509 A | 8/2018 |
| WO | WO-2012/049853 A1 | 4/2012 |

* cited by examiner

*Primary Examiner* — Anthony Ho
(74) *Attorney, Agent, or Firm* — Foley & Lardner LLP

(57) ABSTRACT

A resin package defining a recess includes a first lead having an element-mounting region, a second lead having a wire-connecting region, and a resin body including first to third resin portions. The third resin portion surrounds the element-mounting region. Each of the first and second leads includes a first plating and a second plating covering at least a portion of the first plating. The wire-connecting region is located outward of the third resin portion. The element-mounting region is located on an outermost surface of the second plating. In a top view, the wire-connecting region is located laterally inward of a portion of the second plating of the second lead that has an outermost surface located higher than that of the first plating of the second lead.

20 Claims, 18 Drawing Sheets

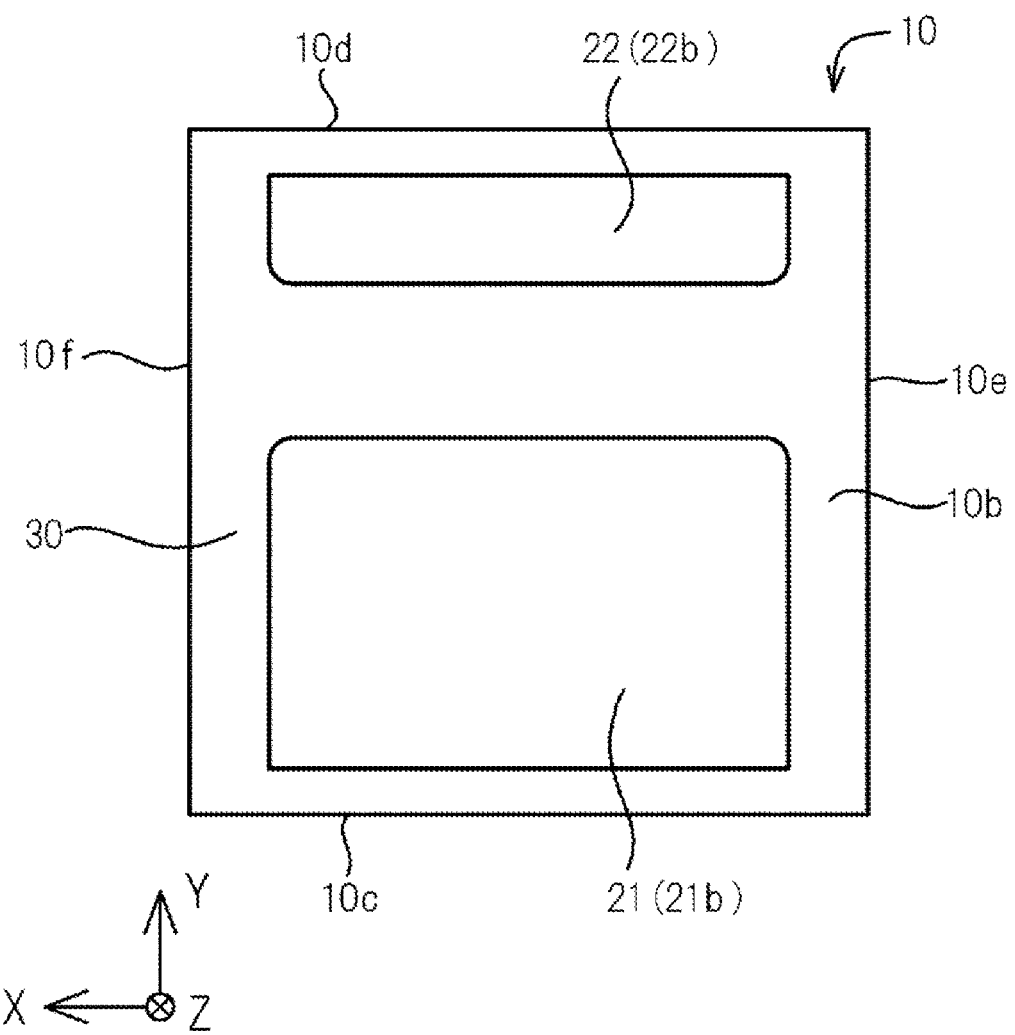

RESIN PACKAGE AND LIGHT EMITTING DEVICE

CROSS-REFERENCE TO RELATED PATENT APPLICATION

This application claims priority to Japanese Patent Application No. 2018-242142, filed on Dec. 26, 2018, the entire disclosure of which is hereby incorporated herein by reference.

BACKGROUND

The present disclosure relates to a resin package and a light emitting device.

Improvement in adhesion between a transparent resin part sealing a wire-bonding portion and an electrically conductive pattern is disclosed, for example, in Japanese Unexamined Patent Application Publication No. 2007-149823A, in which the improvement is obtained using a step formed at a boundary between an Ag-plating and an Au-plating respectively covering portions of the electrically-conductive pattern.

SUMMARY

Further improvement in adhesion between a resin package, which includes an electrically conductive pattern, and a transparent resin member sealing a wire-bonding portion is desirable. Accordingly, one object of certain embodiments of the present invention is to provide a resin package and a light emitting device in each of which adhesion between a wire-connecting region and a resin member in contact with the wire-connecting region is increased.

A resin package according to one embodiment of the present disclosure includes leads and a resin body. The resin package is formed with a recess defined by an upward-facing surface and a lateral surface defining the recess. The leads include a first lead including an element-mounting region, and a second lead including a wire-connecting region. The resin body includes a first resin portion, a second resin portion, and a third resin portion. The upward-facing surface defining the recess includes the element-mounting region, the wire-connecting region, and an upper surface of the first resin portion. The lateral surface defining the recess includes an inner lateral surface of the second resin portion. The third resin portion is located upward of the upward-facing surface defining the recess, and surrounds the element-mounting region with the third resin portion spaced apart from the lateral surface defining the recess. The wire-connecting region is located outward of the third resin portion. Each of the first and second leads includes a plating located at surfaces of each of the first and second leads. The plating include a first plating and a second plating, the second plating of the first lead covering at least a portion of the first plating of the first lead, the second plating of the second lead covering a portion of the first plating of the second lead. The wire-connecting region is located on an outermost surface of the first plating exposed at the upward-facing surface defining the recess. The element-mounting region is located on an outermost surface of the second plating exposed at the upward-facing surface defining the recess. The first plating is made of at least one selected from Au, Au alloy, Pd, and Pd alloy. In a top view, the wire-connecting region is located inward of the second plating, which has an outermost surface located higher than an outermost surface of the first plating, in a lateral direction along the third resin portion.

A light emitting device according to one embodiment of the present disclosure includes a resin package including leads and a resin body, at least one light emitting element, at least one wire, and a resin member. The resin package defines a recess defined by an upward-facing surface defining the recess and a lateral surface defining the recess. The leads include a first lead including an element-mounting region, and a second lead including a wire-connecting region. The resin body includes a first resin portion, a second resin portion, and a third resin portion. The upward-facing surface defining the recess includes the element-mounting region, the wire-connecting region, and an upper surface of the first resin portion. The lateral surface defining the recess includes an inner lateral surface of the second resin portion. The third resin portion is located upward of the upward-facing surface defining the recess, and surrounds the element-mounting region with the third resin portion spaced apart from the lateral surface defining the recess. The wire-connecting region is located outward of the third resin portion. The at least one light emitting element is disposed in the element-mounting region. At least one of the at least one wire electrically connects the wire-connecting region and a corresponding one of the at least one light emitting element. Each of the first and second leads includes a plating located at surfaces of each of the first and second leads. The plating include a first plating and a second plating, the second plating of the first lead covering at least a portion of the first plating of the first lead, the second plating of the second lead covering a portion of the first plating of the second lead. The wire-connecting region is located on an outermost surface of the first plating exposed at the upward-facing surface defining the recess. The element-mounting region is located on an outermost surface of the second plating exposed at the upward-facing surface defining the recess. The first plating is made of at least one selected from Au, Au alloy, Pd, and Pd alloy.

In a top view, the wire-connecting region is located inward of the second plating, which has an outermost surface located higher than an outermost surface of the first plating, in a lateral direction along the third resin portion. The resin member is in contact with the wire-connecting region and the second plating.

Certain embodiments of the present disclosure allows for obtaining a resin package and a light emitting device in each of which adhesion between a wire-connecting region and a resin member in contact with the wire-connecting region is increased.

BRIEF DESCRIPTION OF THE DRAWINGS

FIG. 1B is a schematic bottom view of the resin package according to the first embodiment.

DETAILED DESCRIPTION

Figure 1A:
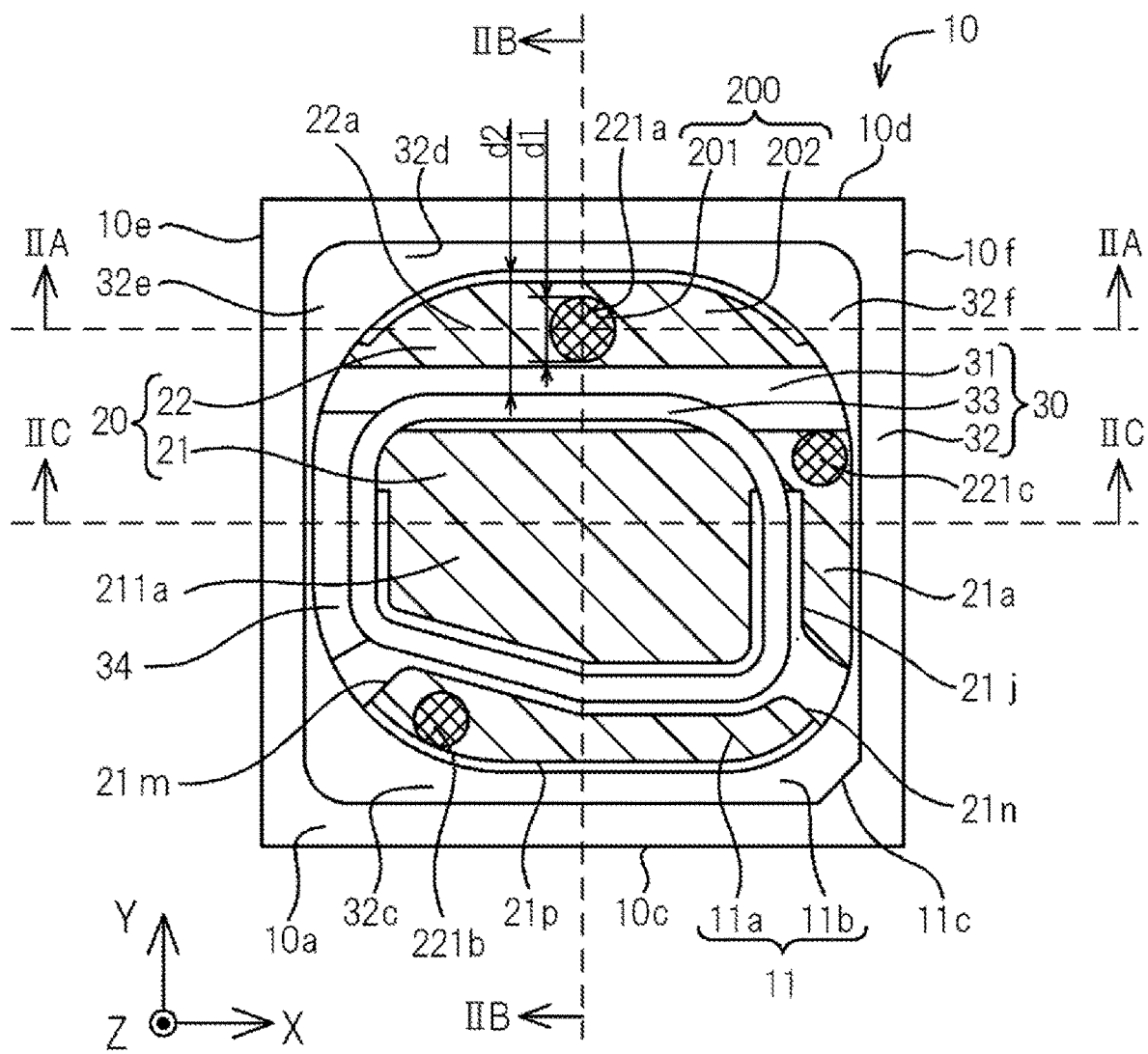
FIG. 1A is a schematic top view of a resin package according to a first embodiment.

Resin packages and light emitting devices according to the present disclosure will be described below in detail with reference to the drawings. Resin packages and/or light emitting devices described in the present disclosure are examples, and the present invention is not limited to the resin packages and/or the light emitting devices described below. In the description below, terms that indicate specific directions or locations (for example, "upper", "lower", and other terms expressing those) may be used. Such terms are used for ease of understanding, and are to be construed as relative directions or positions in the referred drawings, rather than absolute directions or positions. The sizes or positional relationships of members shown in the drawings may be exaggerated for ease of understanding. The sizes of members in the resin package and/or the light emitting device, or the relative sizes of the members in the resin package and/or the light emitting device, may not be reflected in the drawings.

Resin Package 10

With reference to FIGS. 1A to 4B, a resin package 10 according to a first embodiment of the present disclosure will be described.

As shown in FIG. 1A, the resin package 10 defines a recess 11. Specifically, the recess 11 is defined by an upward-facing surface 11a and a lateral surface 11b. The resin package 10 includes leads 20 and a resin body 30. The leads 20 include a first lead 21 including an element-mounting region 211a, and a second lead 22 including a wire-connecting region 221a. The resin body 30 includes a first resin portion 31, a second resin portion 32, and a third resin portion 33. The resin body 30 is molded integrally with the first lead 21 and the second lead 22. The upward-facing surface 11a defining the recess 11 in the resin package 10 includes the element-mounting region 211a, the wire-connecting region 221a, and an upper surface of the first resin portion 31.

The lateral surface 11b defining the recess 11 includes an inner lateral surface of the second resin portion 32. The third resin portion 33 is located above the upward-facing surface 11a defining the recess 11, and surrounds the element-mounting region 211a with the third resin portion 33 spaced apart from the lateral surface 11b defining the recess 11. The wire-connecting region 221a is located outward of the third resin portion 33. Each of the first and second leads 21 and 22 includes a plating 200 located at surfaces of each of the first and second leads 21 and 22. The plating 200 can include a first plating 201 and a second plating 202 that covers a portion of the first plating 201. The second lead 22 includes the wire-connecting region 221a on an outermost surface of the first plating 201 exposed at the upward-facing surface 11a defining the recess 11. The first lead 21 includes the element-mounting region 211a on an outermost surface of the second plating 202 exposed at the upward-facing surface 11a defining the recess 11. The first plating is made of at least one selected from Au, Au alloy, Pd, and Pd alloy. In a top view, the second lead 22 includes the wire-connecting region 221a located inward of the second plating 202, which has an outermost surface located higher than an outermost surface of the first plating 201, in a lateral direction along the third resin portion 33. The element-mounting region 211a is a region on which a light emitting element will be disposed. The outermost surface of the second plating 202 exposed at the upward-facing surface 11a defining the recess 11 includes the element-mounting region 211a, which is a portion of an upper surface 21a of the first lead 21 located inward of the third resin portion 33. The wire-connecting region 221a is a region to which a wire will be connected. The outermost surface of the first plating 201 exposed at the upward-facing surface 11a defining the recess 11 includes the wire-connecting region 221a, which is a portion of an upper surface 22a of the second lead 22 located between the second resin portion 32 and the third resin portion 33.

The wire-connecting region 221a is located between the lateral surface 11b defining the recess 11 and the third resin portion 33. With this structure, when forming a resin member in contact with the wire-connecting region 221a, the resin member is easily in contact with the lateral surface 11b defining the recess 11, and the third resin portion 33. Accordingly, a contact area between the resin member and the resin package 10 can be increased, which allows for obtaining the resin package 10 in which adhesion between the wire-connecting region 221a and the resin member is increased. Further, in a top view, the second lead 22 includes the wire-connecting region 221a located inward of the second plating 202, which has the outermost surface located higher than the outermost surface of the first plating 201, in a lateral direction along the third resin portion 33 in a top view as shown in FIG. 1A. With this structure, when forming the resin member in contact with the wire-connecting region 221a, the resin member is easily in contact with the second plating 202 located outward the wire-connecting region 221a. Accordingly, a contact area between the resin member and the resin package 10 can be increased, which allows for obtaining the resin package 10 with an increased adhesion to the resin member in contact with the wire-connecting region 221a. Further, with the wire-connecting region 221a located outward of the third resin portion 33, a light emitted from the light emitting element on the element-mounting region 211a can be prevented from being directly irradiated to a portion of the resin member in contact with the wire-connecting region 221a. Accordingly, deterioration of the portion of the resin member in contact with the wire-connecting region 221a can be reduced. This allows for obtaining a resin package with an increased adhesion to the resin member 50 in contact with the wire-connecting region 221a.

Figure 2A:
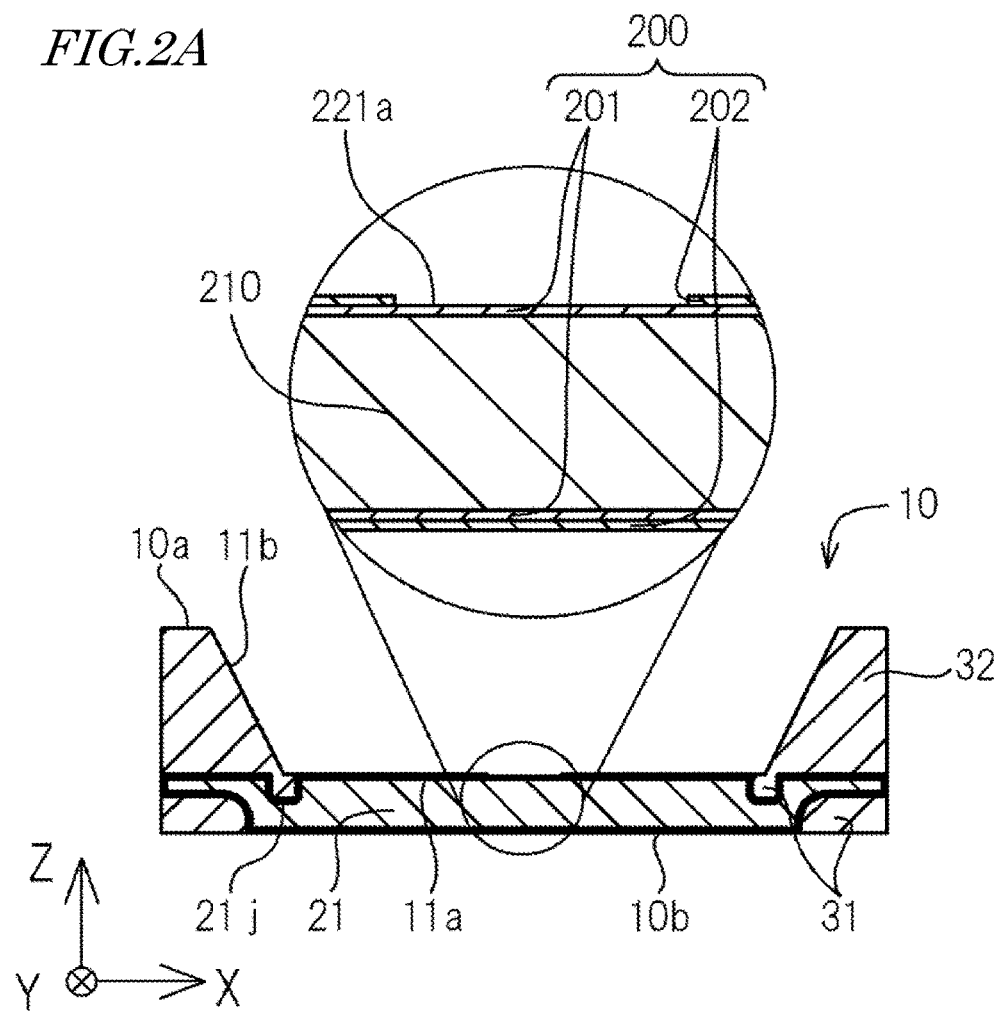
FIG. 2A is a schematic cross-sectional end view of the resin package taken along line IIA-IIA in FIG. 1A.

As shown in FIG. 2A, the resin package 10 includes an upper surface 10a and the lower surface 10b opposite to the upper surface 10a. In the present embodiment, the resin package 10 has a substantially quadrangular outer shape in a top view. Accordingly, the resin package 10 includes a first outer lateral surface 10c, a second outer lateral surface 10d opposite to the first outer lateral surface 10c, a third outer lateral surface 10e adjacent to the first and second lateral surfaces 10c and 10d, and a fourth outer lateral surface 10f opposite to the third outer lateral surface 10e. An outer shape of the resin package 10 in a plan view is not limited to a quadrangular shape, and the resin package 10 may have another outer shape in a plan view. Further, in a plan view, an opening 11c of the resin package 10 may include a truncated corner portion, which serves as an anode mark or a cathode mark. The anode mark or the cathode mark functions as a mark indicating a polarity of the first lead 21 or the second lead 22.

The resin package 10 defines the recess 11 having the opening 11c in the upper surface 10a of the resin package 10. A portion of the upper surface 21a of the first lead 21, a portion of the upper surface 22a of the second lead 22, and a portion of a surface of the first resin portion 31 of the resin body 30 are exposed on the upward-facing surface 11b defining the recess 11.

Figure 3A:
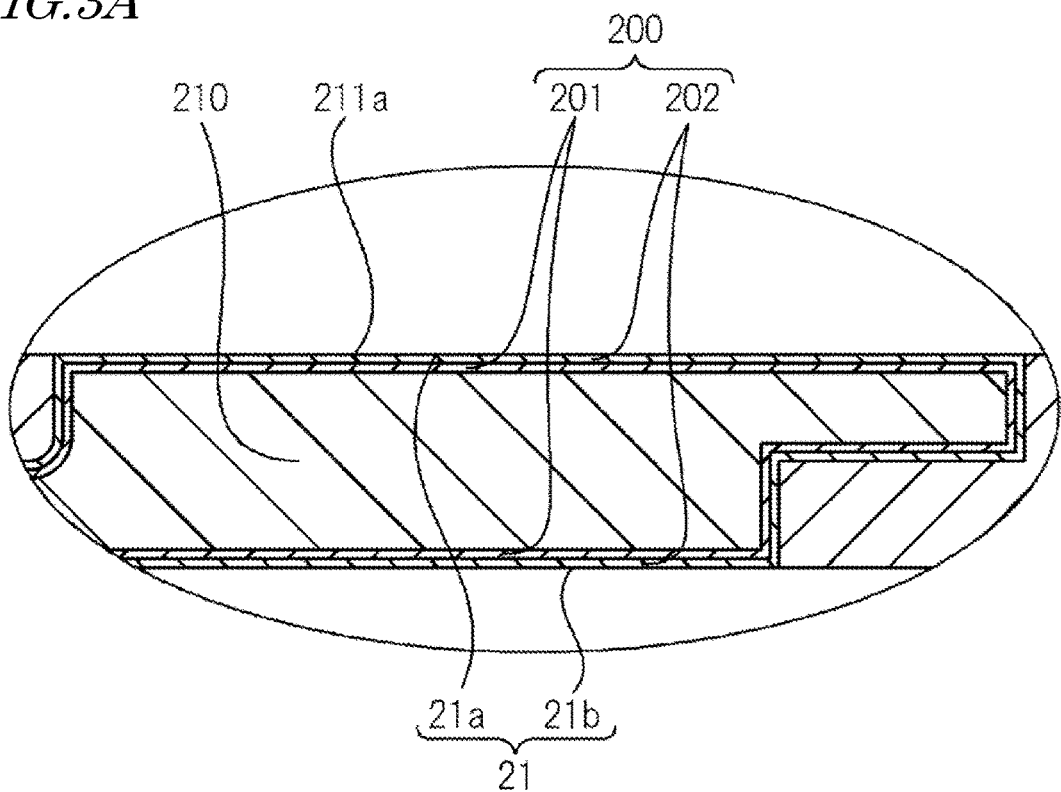
FIG. 3A is a schematic enlarged view of a region indicated by IIIA in FIG. 2B.
Figure 3B:
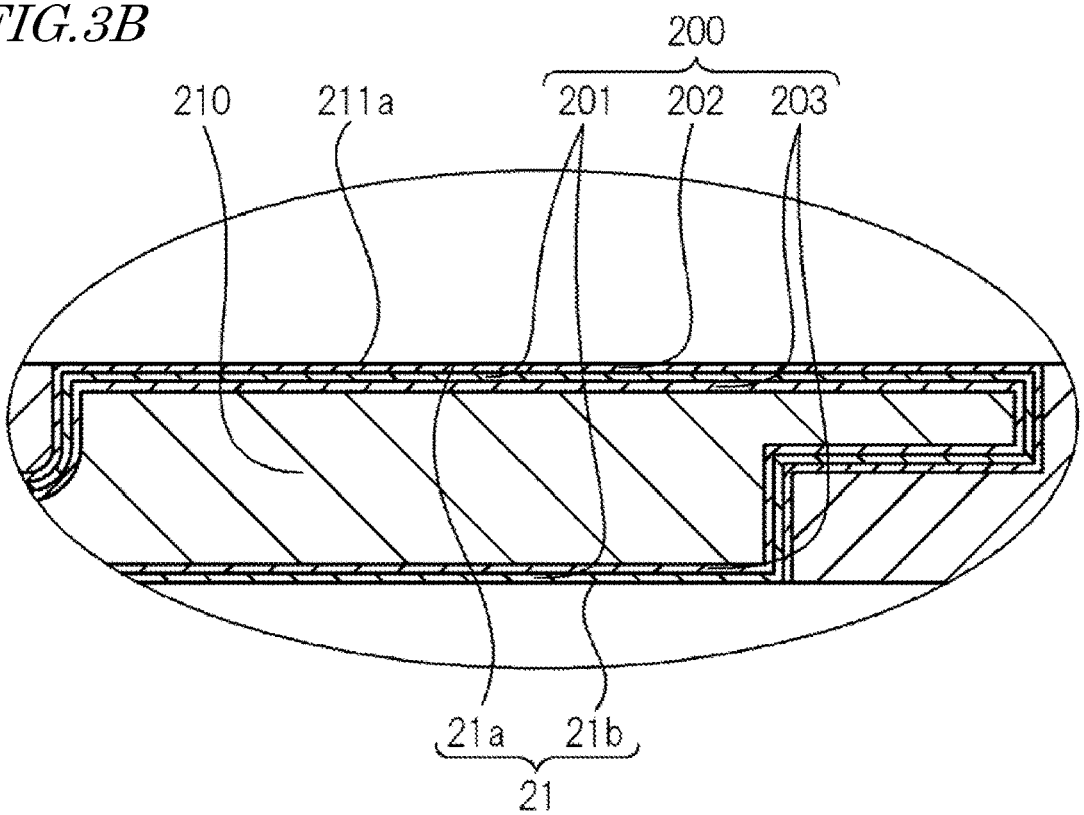
FIG. 3B is a schematic enlarged view showing a variant example of a region indicated by IIIA in FIG. 2B.

As shown in FIG. 1B, a lower surface 21b of the first lead 21 and a lower surface 22b of the second lead 22 are exposed at the lower surface 10b of the resin package 10. The lower surface 21b, which is an outermost surface, of the first lead 21 exposed from the resin body 30 may be a surface of the second plating 202 covering the first plating 201 as shown in FIG. 3A, or a surface of the first plating 201 as shown in FIG. 3B. When the lower surface 21b, which is an outermost surface, of the first lead 21 is a surface of the second plating 202, a base member 210 of the first lead 21 is covered by the first plating 201 and the second plating 202, so that the base member 210 of the first lead 21 can be prevented from being exposing to an outside. The base member of the first lead 21 is covered by the plating 200. When the lower surface 21b of the first lead 21, which is an outermost surface, is a surface of the first plating 201, a material cost of the resin package 10 can be lower than that in the case where the lower surface 21b of the first lead 21 is a surface of the second plating 202 covering the first plating 201. Further, the first plating 201 is made of at least one selected from Au, Au alloy, Pd, and Pd alloy. When the lower surface 21b of the first lead 21, which is an outermost surface, is a surface of the first plating 201, sulfurization of the lower surface 21b of the first lead 21 can be reduced. The lower surface 22b, which is an outermost surface, of the second lead 22 exposed from the resin body 30 may be a surface of the first plating 201, or a surface of the second plating 202 covering the first plating 201.

Examples of the Au alloy include AuAg alloy, Au alloy, AuIn alloy, AuTl alloy, AuSb alloy, and AuSn alloy.

The content of Au in the Au alloy is preferably 70 mass % or more, more preferably 80 mass % or more, and further preferably 85 mass % or more. The "mass %" indicates a ratio of a mass of Au to the total mass of the Au alloy. Examples of the Pd alloy include PdAu alloy, PdAg alloy, PdNi alloy, PdIn alloy, PdTe alloy, PdGe alloy, PdBi alloy, and PdSe alloy. The content of Pd in the Pd alloy is, for example, preferably 60 mass % or more, more preferably 70 mass % or more, and further preferably 75 mass % or more.

First Lead 21, Second Lead 22

The first lead 21 and the second lead 22 are electrically conductive, and function as electrodes for supplying electricity to the light emitting element and as heat dissipating members that are thermally conductive. In the present embodiment, the leads 20 include the first lead 21 and the second lead 22. The resin package 10 may further include a third lead, in addition to the first lead 21 and the second lead 22. When the resin package 10 includes the first lead 21, the second lead 22, and the third lead, the third lead may be disposed between the first lead 21 and the second lead 22. In this case, the third lead may function as a heat dissipating member, and the first lead 21 and the second lead 22 may function as electrodes. The resin package 10 may include four or more leads.

Figure 4A:
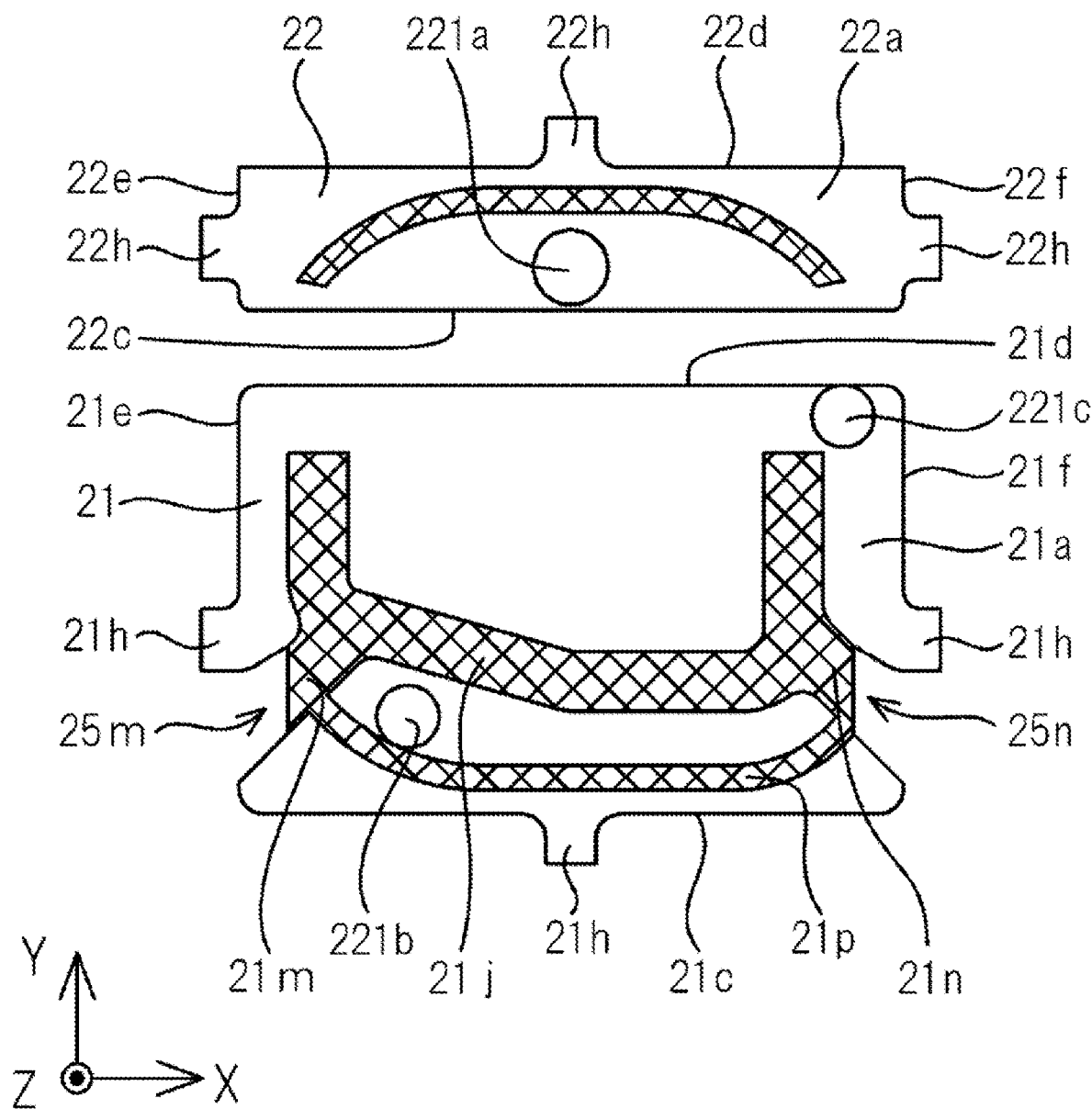
FIG. 4A is a schematic top view of a first lead and a second lead in a resin package according to the first embodiment.
Figure 4B:
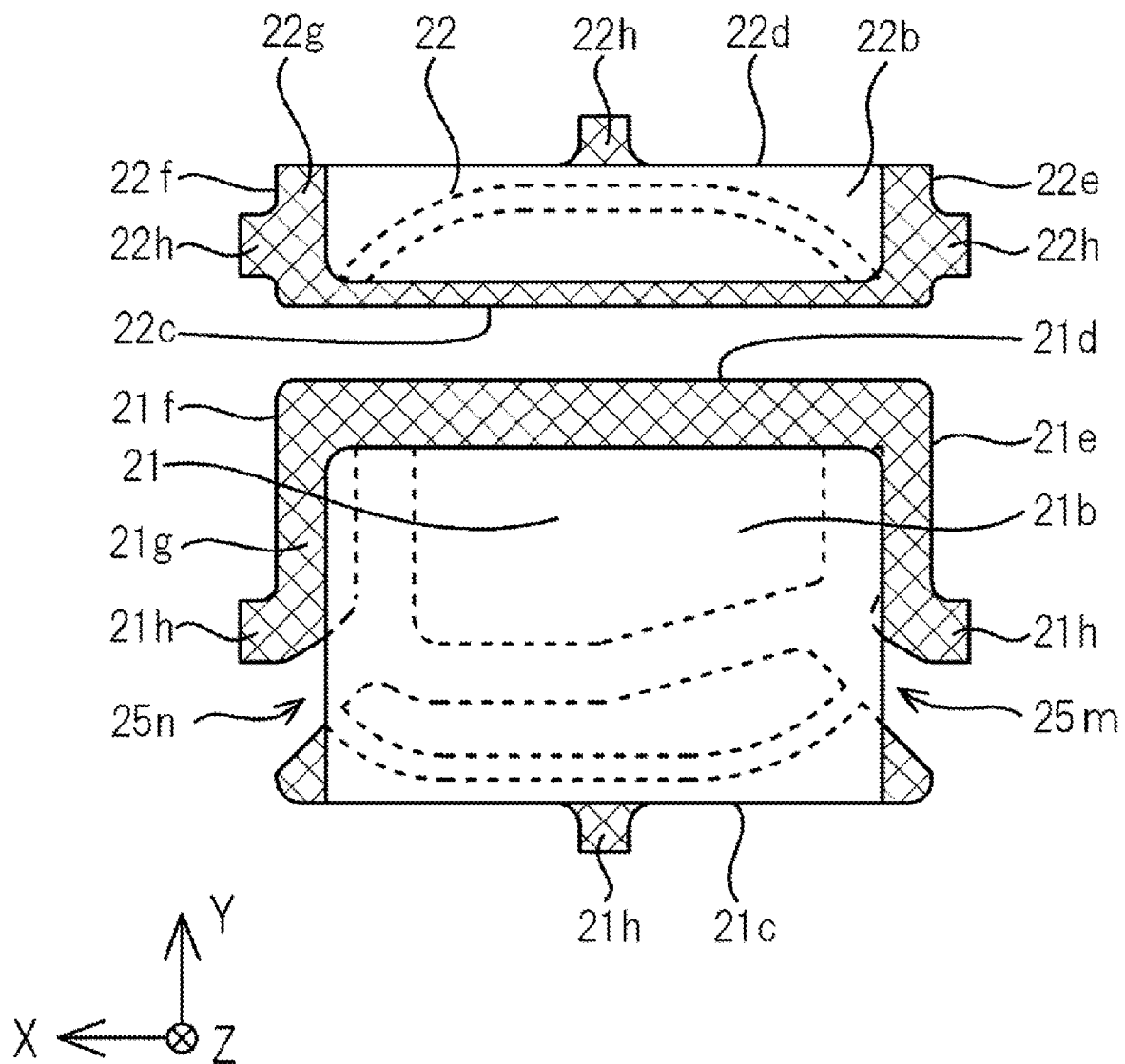
FIG. 4B is a schematic bottom view of the first lead and the second lead in the resin package according to the first embodiment.

As shown in FIGS. 4A and 4B, the first lead 21 has a substantially rectangular shape in a plan view, and has a first to a fourth lateral surfaces 21c, 21d, 21e, and 21f. The second lateral surface 21d of the first lead 21 faces the second lead 22. The first lateral surface 21c is located opposite to the second lateral surface 21d. The third lateral surface 21e and the fourth lateral surface 21f are located opposite to each other, and do not face the second lead 22.

As shown in FIG. 4B, the first lead 21 is formed with a first peripheral recess 21g (indicated by hatching in FIG. 4B) along the second to fourth lateral surfaces 21d, 21e, and 21f, at a lower surface 21b side of the second to fourth lateral surfaces 21d, 21e, and 21f. The first peripheral recess 21g is recessed from the lower surface 21b of the first lead 21 toward the upper surface 21a of the first lead 21. The first peripheral recess 21g can be formed by using etching, pressing, etc.

Figure 1C:
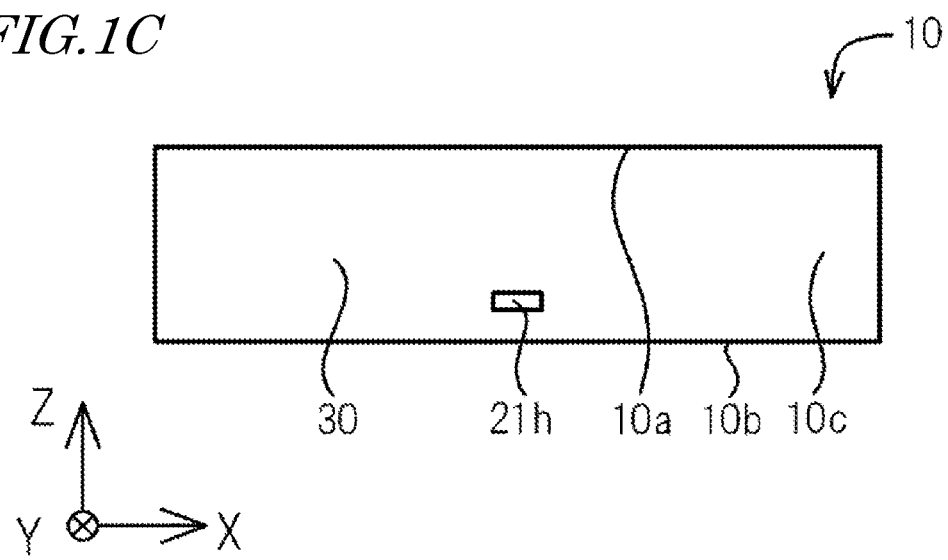
FIG. 1C is a schematic front view of the resin package according to the first embodiment.
Figure 1D:
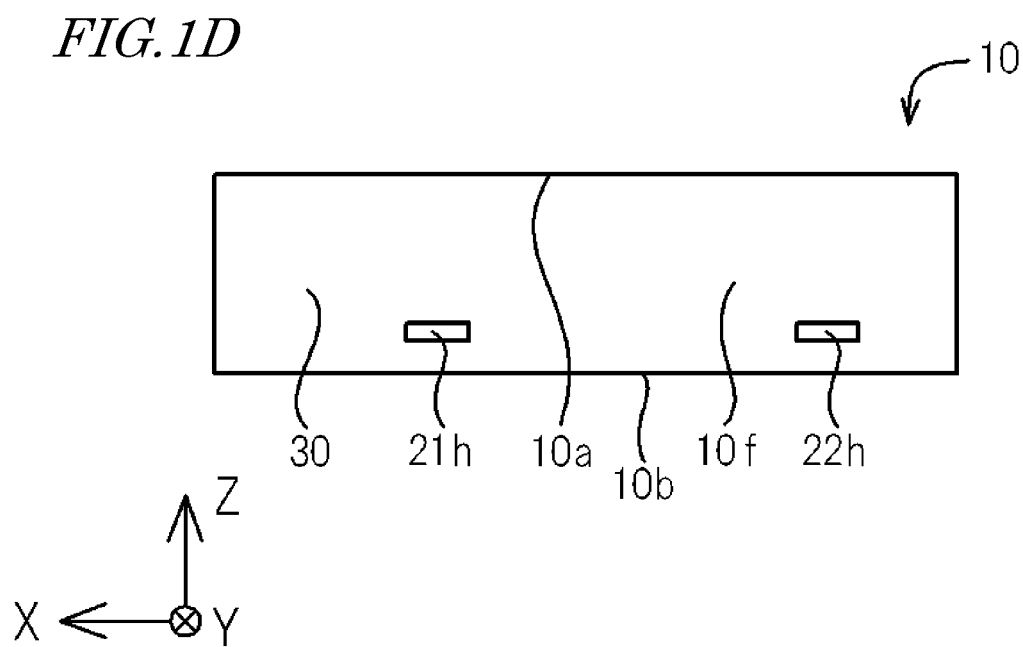
FIG. 1D is a schematic side view of the resin package according to the first embodiment.

In a top view, the first lead 21 includes extending portions 21h, each of which is located at or near the center of a respective one of the lateral surfaces 21c, 21e, and 21f. The extending portions 21h are portions of the first lead 21. The extending portions 21h at the first lateral surface 21c, the third lateral surface 21e, and the fourth lateral surface 21f have respective end surfaces exposed from the resin body 30 at the first, third, and fourth outer lateral surfaces 10c, 10e, and 10f, respectively, of the resin package 10. For example, as shown in FIG. 1C, at the first outer lateral surface 10c of the resin package 10, an end surface of a corresponding extending portion 21h is exposed from the resin body 30. Further, as shown in FIG. 1D, at the fourth outer lateral surface 10f of the resin package 10, an end surface of a corresponding extending portion 21h is exposed from the resin body 30. At each of the first, third, and fourth outer lateral surfaces 10c, 10e, and 10f of the resin package 10, an end surface of a respective one of the extending portions 21h of the first lead 21 and a corresponding surface of the resin body 30 are substantially in the same plane. Each of the extending portions 21h extends from a main body portion of the first lead 21 toward a respective one of the first, third, and fourth outer lateral surfaces 10c, 10e, and 10f of the resin package 10. In the present specification, the term "main body portion of the first lead 21" refers to a portion of the first lead 21 other than the extending portions 21h. As shown in FIG. 4A and FIG. 4B, the main body portion of the first lead 21 has a substantially quadrangular outer shape in a plan view.

The third and fourth lateral surfaces 21e and 21f of the first lead 21 respectively define first and second through-indentations 25m and 25n. The first and second through-indentations 25m and 25n respectively open outwards at outer peripheries of the third and fourth lateral surfaces 21e and 21f. The first and second through-indentations 25m and 25n can also be recesses defined in the third fourth lateral surfaces 21e and 21f, respectively. The first and second through-indentations 21e and 21f are not necessarily formed by cutting off a portion of each of the third and fourth lateral surfaces 21e and 21f. The third and fourth lateral surfaces 21e and 21f and the through-indentations 25m and 25n may be formed simultaneously by using etching or pressing. The through-indentations 25m and 25n and the first peripheral recess 21g are filled with a portion of the resin body 30. This allows for improving adhesion between the resin body 30 and the first lead 21.

A first groove 21j, second grooves 21m and 21n, and a third groove 21p are formed in the upper surface 21a of the first lead 21. In a top view, the first groove 21j is located surrounding at least a portion of the element-mounting region 211a. The expression "first groove 21j is located surrounding at least a portion of the element-mounting region 211a" as used herein indicates that the first groove 21j may be located surrounding an entirety of the element-mounting region 211a, or may be located partially surrounding the element-mounting region 211a. The first resin portion 31 of the resin body 30 is disposed in the first groove 21j.

It is preferable that the first groove 21j, the second grooves 21m and 21n, and the third groove 21p do not overlap the first peripheral recess 21g along the second to fourth lateral surfaces 21d, 21e, and 21f of the first lead 21 in a plan view. Without overlapping between the first groove 21j in the upper surface 21a of the first lead 21 and the first peripheral recess 21g at the lower surface 21b side of the first lead 21, the first lead 21 does not have a portion with a thickness reduced due to grooves in both the upper surface 21a and the lower surface 21b of the first lead 21, so that reduction in strength of the first lead 21 can be inhibited. Similarly, the first groove 21j, the second groove 21m and 21n, and the third groove 21p of the first lead 21 do not overlap the first peripheral recess 21g along the second lateral surface 21d of the first lead 21, which can reduce reduction in strength of the first lead 21.

The second groove 21m of the first lead 21 connects the through-indentation 25m, the first groove 21j, and the third groove 21p. Similarly, the second groove 21n of the first lead 21 connects the through-indentation 25n, the first groove 21j, and the third groove 21p. The first resin portion 31 of the resin body 30 is disposed in the second grooves 21m and 21n.

The third groove 21p is connected to the second grooves 21m and 21n. The first resin portion 31 of the resin body 30 is disposed in the third groove 21p. This structure allows for improving adhesion between the first lead 21 and resin body 30.

As shown in FIGS. 4A and 4B, the second lead 22 has a substantially rectangular shape in a plan view, and has first to fourth lateral surfaces 22c, 22d, 22e, and 22f. The second lateral surface 21d of the first lead 21 faces the first lateral surface 22c of the second lead 22. As shown in FIG. 4B, the second lead 22 includes a second peripheral recess 22g along the first, third, and fourth lateral surfaces 22c, 22e, and 22f of the lower surface 22b. In a top view, the second lead 22 includes extending portions 22h, each of which is located at the center or near the center of a respective one of the second to fourth lateral surfaces 22d, 22e, and 22f. The extending portions 22h are portions of the second lead 22. The extending portion 22h at each of the second to fourth lateral surfaces 22d, 22e, and 22f has an end surface exposed from the resin body 30 at a respective one of the outer lateral surfaces 10d, 10e, and 10f of the resin package 10. At each of the outer lateral surfaces 10d, 10e, and 10f of the resin package 10, an end surface of a corresponding extending portion 22h of the second lead 22 and a corresponding surface of the resin body 30 are in the same plane. Each of the extending portions 22h extends from a main body portion of the second lead 22 toward a respective one of the outer lateral surfaces 10d, 10e, and 10f of the resin package 10. As used herein, the term "the main body portion of the second lead 22" refers to a portion of the second lead 22 other than the extending portions 22h. As shown in FIG. 4A and FIG. 4B, the main body portion of the second lead 22 has a substantially quadrangular outer shape in a plan view.

In the present embodiment, the first lead 21 includes an element-mounting region 211a on which a light emitting element will be mounted, and accordingly the first lead 21 has an area greater than an area of the second lead 22 in a top view. However, sizes of the first lead 21 and the second lead 22 may be in any other relationship. For example, the first lead 21 including the element-mounting region 211a may have a size greater than the second lead 22 not including an element-mounting region. When the second lead 22 includes the element-mounting region, the second lead 22 may have an area greater than an area of the first lead 21 in a top view. The element-mounting region may be disposed across the first lead 21 and the second lead 22. In this case, in a top view, an area of the first lead 21 and an area of the second lead 22 may be substantially the same. When the plurality of leads 20 include the first lead 21, the second lead 22, and a third lead and the first lead 21 is located between the second lead 22 and the third lead, for example, in a top view, the second lead 22 and the third lead may have the same area and the first lead 21 may have an area greater than an area of each of the second lead 22 and the third lead.

The first peripheral recess 21g and the through-indentations 25m and 25n in the first lead 21 are provided for improvement in adhesion between the resin body 30 and the first lead 21. Further, the second peripheral recess 22g in the second lead 22 are provided for improvement in adhesion between the resin body 30 and the second lead 22.

A lead frame includes a frame, a plurality of connecting portions, and a plurality of pairs of main body portions connected via the plurality of connecting portions, in which each pair of the main body portions include a main body portion of the first lead 21, and a main body portion of the second lead 22. The lead frame is integrally molded with the resin body 30, and then is cut at the connecting portions to be separated into individual resin packages 10. The extending portions 21h and 22h are parts of connecting portions connecting the main body portion of the first lead 21 and the main body portion of the second lead 22, respectively, to the frame.

Accordingly, an end surface of each of the extending portions 21h and 22h, which are used to be portions of the connecting portions, is exposed on a corresponding one of the second to fourth outer lateral surfaces 10c, 10d, 10e, and 10f of the resin package 10 such that each of the extending portions 21h and 22h and a corresponding surface of the resin body 30 are in the same plane. After separation into individual resin packages 10, the first lead 21 includes a main body portion and corresponding extending portions 21h. Similarly, the second lead 22 includes a main body portion and corresponding extending portions 22h.

Each of the first and second leads 21 and 22 includes a base member 210 and a plating 200 covering the base member 210. The base member 210 is preferably a plate-shaped member. For the base member 210, a known material such as Cu, Al, or alloy of these can be used. These materials may be used in a single-layer structure or a multi-layer structure (for example, a clad member). In particular, for the base member 210, copper, which is inexpensive and has a high heat dissipation performance, is preferably used.

Figure 3C:
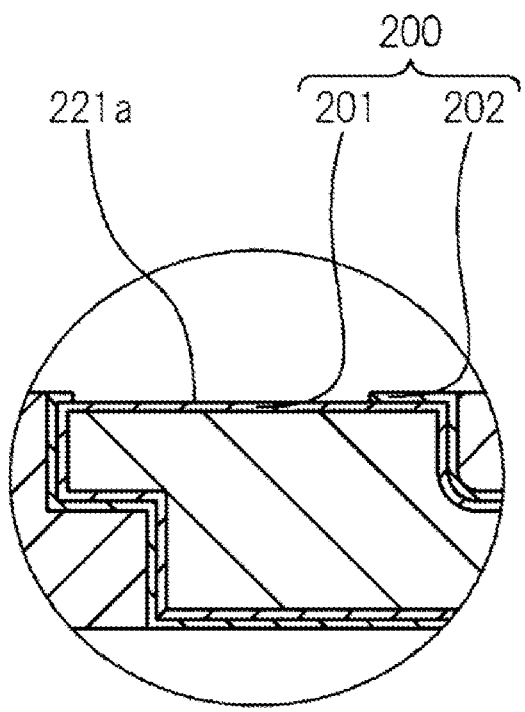
FIG. 3C is a schematic enlarged view of a region indicated by IIIB in FIG. 2B.

The plating 200 can include the first plating 201 and the second plating 202 that covers a portion of the first plating 201. As shown in FIG. 3C, the wire-connecting region 221a is located on an outermost surface of the first plating 201. The first plating 201 is made of at least one selected from Au, Au alloy, Pd, and Pd alloy. Au, Au alloys, Pd, and Pd alloys are metals that less easily react with a sulfur component compared to Ag. Accordingly, with the wire-connecting region 221a made of at least one selected from Au, Au alloy, Pd, and Pd alloy, sulfurization of the wire-connecting region 221a can be reduced. Thus, disconnection of a wire can be inhibited.

As shown in FIG. 2A, in a top view, the wire-connecting region 221a is located inward of the second plating 202, which has an outermost surface located higher than an outermost surface of the first plating 201, in a lateral direction along the third resin portion 33. With this structure, a portion of the resin member in contact with the wire-connecting region 221a is easily in contact with the second plating 202 located outward the wire-connecting region 221a. This structure allows for facilitating increase in adhesion between the resin member in contact with the wire-connecting region 221a and the resin package 10. As shown in FIG. 1A, in a top view, the wire-connecting region 221a may be surrounded by the second plating 202, which has an outermost surface located higher than an outermost surface of the first plating 201. This structure allows for further facilitating increase in adhesion between the resin member in contact with the wire-connecting region 221a and the resin package 10.

The wire-connecting region 221a may have any appropriate size in a top view. For example, as shown in FIG. 1A, a length d1 of the wire-connecting region 221a in a direction (Y-direction) perpendicular to a direction (X-direction) in which the wire-connecting region 221a is located inward of the second plating 202 along the third resin portion 33 is preferably in a range of 0.03 to 0.7 times, more preferably in a range of 0.4 to 0.6 times, of a distance d2 between the second resin portion 32 and the third resin portion 33 between which the wire-connecting region 221a is located. With such a size of the wire-connecting region 221a, the wire can be easily connected to the wire-connecting region 221a, and light emitted from the light emitting element are not easily absorbed by the wire. Further, the wire-connecting region 221a has a length in the X-direction in a range of 0.8 to 1.22 times of a length of the wire-connecting region 221a in the Y-direction. In a top view, the wire-connecting region 221a may have any appropriate shape, and may have a circular shape, an elliptic shape, a rectangular shape, another polygonal shape, etc.

The first plating 201 may have the same thickness at the upper surface 21a side and at the lower surface 21b side of the first lead 21. Alternatively, the first plating 201 of the first lead 21 may have a thickness greater at the upper surface 21a side than at the lower surface 21b side, or may have a thickness greater at the lower surface 21b side than at the upper surface 21a side. For example, in an electrolytic plating, shielding plates with different sizes are disposed between an anode and a cathode such that cathode current density distribution is different at the upper surface 21a side and at the lower surface 21b side, so that the first plating 201 having a thickness different at the upper surface 21a side and at the lower surface 21b side can be formed. With a thickness of the first plating 201 of the first lead 21 greater at the upper surface 21a side than at the lower surface 21b side, flatness of the first plating 201 at the upper surface 21a side can be increased, so that light emitted from the light emitting element can be efficiently reflected upward. With a thickness of the first plating 201 of the first lead 21 greater at the lower surface 21b side than at the upper surface 21a side, when mounting the resin package 10 on a mounting substrate via a bonding member, bonding strength between the resin package 10 and the bonding member can be increased. The first plating 201 of the second lead 22 may have the same thickness at the upper surface 22a side and at the lower surface 22b side. Alternatively, the first plating 201 of the second lead 22 may have a thickness greater at the upper surface 22a side than at the lower surface 22b side, or may have a thickness greater at the lower surface 22b side than at the upper surface 22a side.

The second plating 202 of the first lead 21 may have the same thickness at the upper surface 21a side and at the lower surface 21b side. Alternatively, the second plating 202 of the first lead 21 may have a thickness greater at the upper surface 21a side than at the lower surface 21b side, or may have a thickness greater at the lower surface 21b side than at the upper surface 21a side. With a thickness of the second plating 202 of the first lead 21 greater at the upper surface 21a side than at the lower surface 21b side, flatness of the second plating 202 at the upper surface 21a side can be increased, so that light emitted from the light emitting element can be efficiently reflected upward. With a thickness of the second plating 202 of the first lead 21 greater at the lower surface 21b side than at the upper surface 21a side, when mounting the resin package 10 on a mounting substrate via a bonding member, bonding strength between the resin package 10 and the bonding member can be increased. The second plating 202 of the second lead 22 may have the same thickness at the upper surface 22a side and at the lower surface 22b side. Alternatively, the second plating 202 of the second lead 22 may have a thickness greater at the upper surface 22a side than at the lower surface 22b side, or may have a thickness greater at the lower surface 22b side than at the upper surface 22a side.

As shown in FIG. 1A, the first lead 21 may further include wire-connecting regions 221b and 221c. In the present example, as in the wire-connecting region 221a, in a top view, the second lead 22 includes the wire-connecting regions 221b and 221c located inward of the second plating 202, which has the outermost surface located higher than the outermost surface of the first plating 201, in directions along the third resin portion 33 in a top view as shown in FIG. 1A. This structure allows for facilitating increase in adhesion between the resin member in contact with the wire-connecting regions 221b and 221c and the resin package 10.

As shown in FIG. 3B, the plating 200 covering the base member 210 may further include a third plating 203 between the base member 210 and the first plating 201. The third plating 203 may have a single layer structure or may have a layered structure of a plurality of layers. For example, when using Cu or Cu alloy for the base member 210, the third plating 203 preferably has a layered structure in which a Ni layer and a Pd layer are layered, and that the first plating 201 is preferably made of Au. With the third plating 203, Cu in the base member can be inhibited from diffusing toward the first plating 201 and the second plating 202. Accordingly, reduction in adhesion of the first plating 201, the second plating 202, the third plating 203 can be reduced.

As shown in FIG. 3A, the element-mounting region 211a is located on an outermost surface of the second plating 202. With respect to a peak emission wavelength of a light emitting element to be disposed on the element-mounting region 211a, the second plating 202 preferably has a reflectance greater than a reflectance of the first plating 201. With such a reflectance, the resin package 10 with high light extraction efficiency can be obtained. For example, the second plating 202 is preferably made of at least one selected from Ag and Ag alloy. Because Ag and Ag alloy have high reflectances, a reflectance of the second plating 202 for the peak emission wavelength of the light emitting element can be higher than a reflectance of the first plating 201 for the peak emission wavelength of the light emitting element. Accordingly, the resin package 10 with high light extraction efficiency can be obtained.

Examples of the Ag alloy include AgAu alloy, AgPd alloy, and AgIn alloy. The content of Ag in the Ag alloy is preferably 70 mass % or more, more preferably 80 mass % or more, and further preferably 85 mass % or more.

When using Ag or Ag alloy for the second plating 202, a protective layer made of silicon oxide, aluminum oxide, or the like may be disposed on a surface of the second plating 202. This structure allows for inhibiting discoloration of the second plating 202, for which Ag or Ag alloy used, caused by sulfur components in the air. The protective layer can be formed using, for example, a vacuum process such as a sputtering, or using other known techniques.

The resin body 30 is molded integrally with the first lead 21 and the second lead 22. The resin package 10 includes the resin body 30, the first lead 21, and the second lead 22. Further, the resin body 30 includes the first resin portion 31, the second resin portion 32 and the third resin portion 33.

Figure 2B:
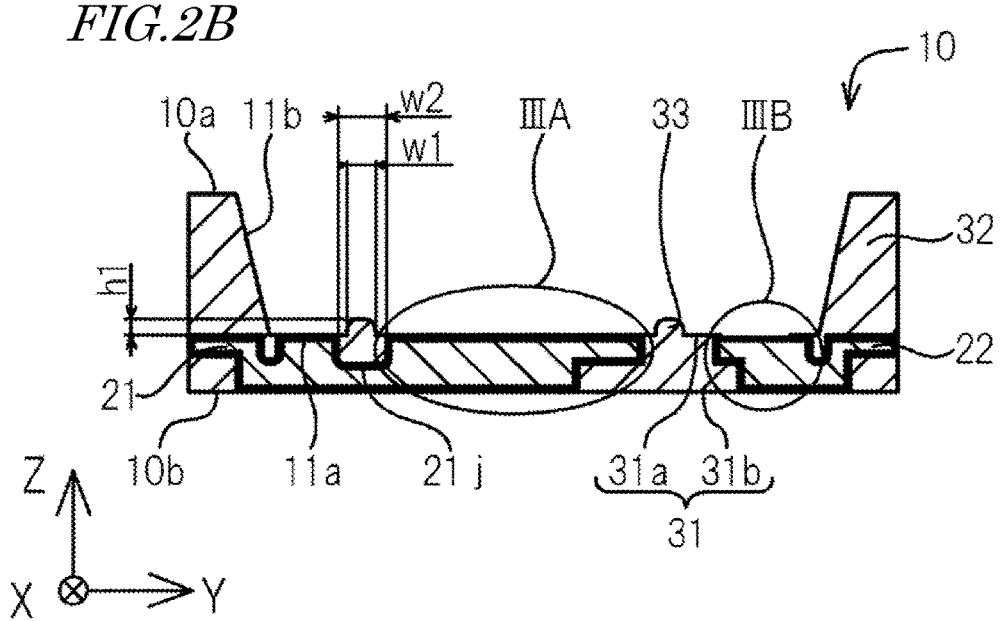
FIG. 2B is a schematic cross-sectional end view of the resin package taken along line IIB-IIB in FIG. 1A.

As shown in FIG. 2B, the first resin portion 31 includes an upper surface 31a and a lower surface 31b. The upper surface 31a is included in the upward-facing surface 11a defining the recess 11. The lower surface 31b of the first resin portion 31 is included in the lower surface 10b of the resin package 10. The first resin portion 31 corresponds to portions of the resin body 30, located at or below an uppermost surface of each of the leads 20 in Z-direction. In Y-direction, the first resin portion 31 is a portion of the resin body 30 located between the first lead 21 and the second lead 22, and also located in the first groove 21j, the second grooves 21m and 21n, and the third groove 21p. When the resin package 10 includes the third lead, the first resin portion 31 is further located between the first lead 21 and the second lead 22, and between the second lead 22 and the third lead.

The second resin portion 32 includes the lateral surface 11b defining the recess 11. The second resin portion 32 corresponds to portions of the resin body 30, located upward with respect to the first resin portion 31. The second resin portion 32 includes four inner lateral wall surfaces, i.e., a first to fourth inner lateral wall surfaces 32c, 32d, 32e, and 32f. The first inner lateral wall surface 32c and the second inner lateral wall surface 32d face each other, and the third inner lateral wall surface 32e and the fourth inner lateral wall surface 32f face each other. In the present embodiment, the lateral surface 11b defining the recess 11 includes the first to fourth inner lateral wall surfaces 32c, 32d, 32e, and 32f.

The second resin portion 32 includes a portion of each of the outer lateral surfaces 10c, 10d, 10e, and 10f. The outer lateral surfaces 10c, 10d, 10e, and 10f are located opposite to the inner lateral wall surfaces 32c, 32d, 32e, and 32f, respectively. Each of the outer lateral surfaces 10c, 10d, 10e, and 10f include a corresponding surface of the first resin portion 31 and a corresponding surface of the second resin portion 32.

As shown in FIG. 1A, two adjacent inner lateral wall surfaces of the inner lateral wall surfaces 32c, 32d, 32e, 32f are connected to form a curved surface, such that no clear boundary is formed between adjacent two of the inner lateral wall surfaces 32c, 32d, 32e, 32f In a top view, the opening 11c of the recess 11 has an approximately quadrangular shape with four rounded corners. In a top view, the upward-facing surface 11a defining the recess 11 has an outer periphery with four rounded corners that are formed by circular arcs with a radius greater than a radius of the four rounded corners of the periphery of the opening 11c.

The third resin portion 33 is located above the upward-facing surface 11a defining the recess 11, and surrounds the element-mounting region 211a with the third resin portion 33 spaced apart from the lateral surface 11b defining the recess 11. With the wire-connecting region 221a located outward of the third resin portion 33, absorption of light, emitted from the light emitting element on the element-mounting region 211a, into the wire-connecting region 221a can be reduced. It is preferable that a portion of the first plating 201 in a region surrounded by the third resin portion 33 in a top view is entirely covered by the second plating 202. With this structure, absorption of light, emitted from the light emitting element in the element-mounting region 211a, into the first plating 201 can be reduced. As shown in FIG. 2B, in the present embodiment, the third resin portion 33 has a height h1 from the upper surface 21a of the first lead 21 and a width w1 at the upper surface 21a of the first lead 21, and has a loop shape continuously surrounding the element-mounting region 211a. The expression "along the third resin portion 33" in the present specification refers to be located along a periphery of the third resin portion 33 having a loop shape. The "height h1 of the third resin portion 33" in the present specification refers to a distance in the Z-direction between the upward-facing surface 11a defining the recess 11 of the resin package 10 and an upper end of the third resin portion 33.

The third resin portion 33 includes a portion located upward of the upper surface of the first lead 21 and a portion located upward of the upper surface of the first resin portion 31. With the third resin portion 33 including a portion located upward of the upper surface of the first lead 21, adhesion between the resin body 30 and the first lead 21 can be improved. The first groove 21*j* in the first lead 21 preferably has a width w2 greater than the width w1 of the third resin portion 33. This structure allows for increasing the contact area between the first resin portion 31 and the first lead 21, which improves adhesion between the resin body 30 and the first lead 21.

Figure 2C:
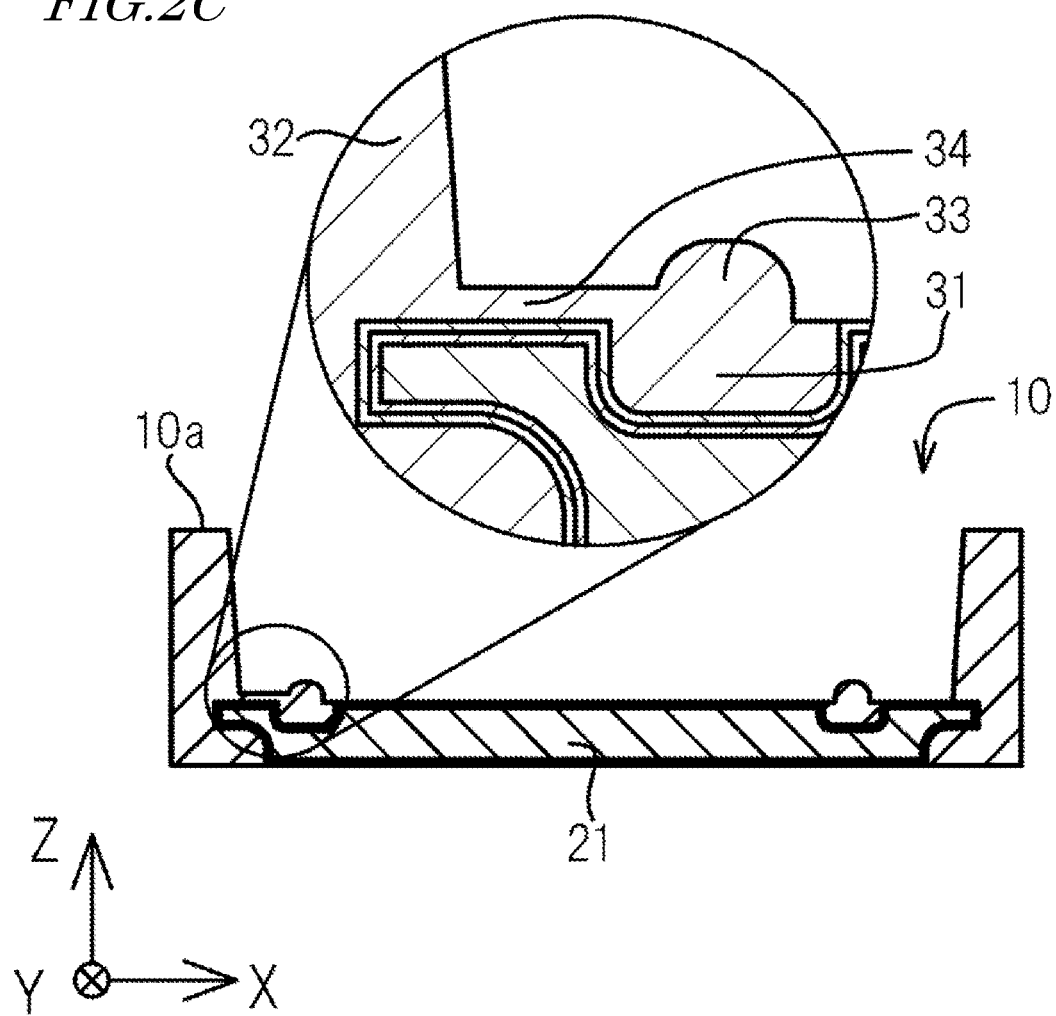
FIG. 2C is a schematic cross-sectional end view of the resin package taken along line IIC-IIC in FIG. 1A.

The resin body 30 may further include a fourth resin portion 34. As shown in FIG. 2C, the fourth resin portion 34 is a portion of the resin body 30 located upward of the uppermost surfaces of the leads 20 and connecting the second resin portion 32 and the third resin portion 33. With the fourth resin portion 34 connecting the second resin portion 32 and the third resin portion 33, the contact area between the resin body 30 and the first lead 21 can be improved.

Figure 3D:
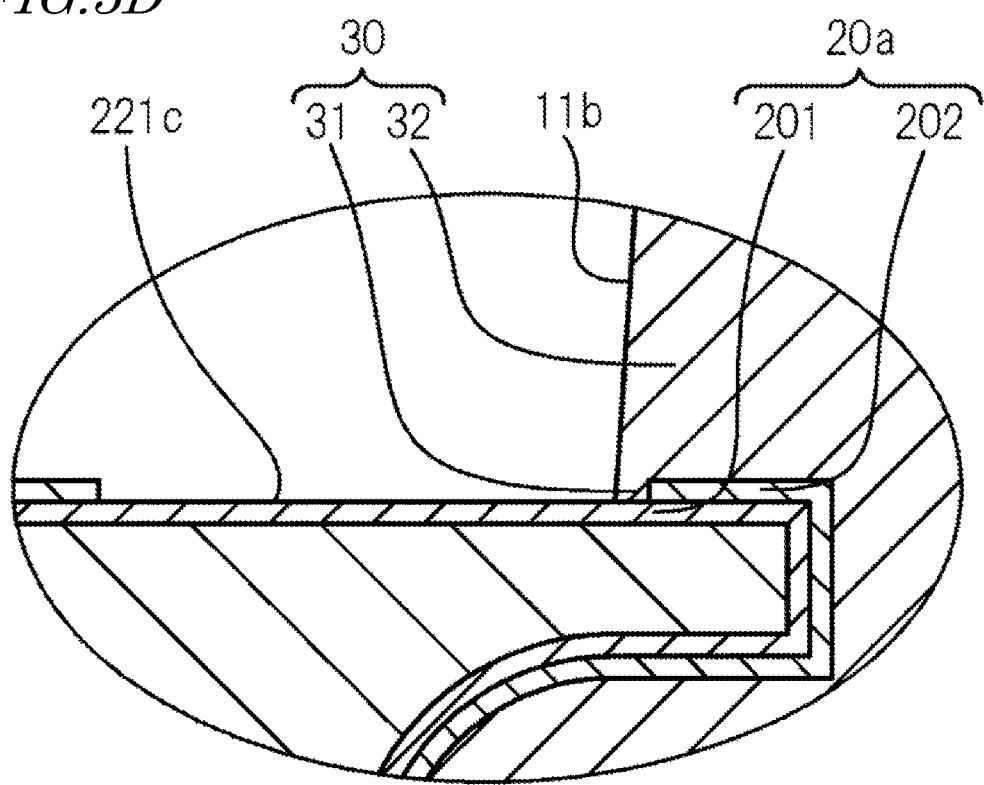
FIG. 3D is a schematic enlarged view showing a variant example of a wire-connecting region and a region near the wire-connecting region according to the first embodiment.

Both the first plating 201 and the second plating 202 may be in contact with the resin body 30. This structure allows for increasing the contact area between the leads 20 and the resin body 30, which improves adhesion between the resin body 30 and the leads 20. For example, as shown in FIG. 3D, a portion of the wire-connecting region 221*c* may be in contact with the first resin portion 31 of the resin body 30. With this structure, the first plating 201 and the second plating 202 are in contact with a surface of the first resin portion 31 included in the lateral surface 11*b* defining the recess 11. This structure allows for improving adhesion between the leads 20 and the resin body 30.

Examples of a resin material used for a base material of the resin body 30 include a thermosetting resin and a thermoplastic resin. More specific examples of the resin material used for a base material of the resin body 30 include a cured body of an epoxy resin composite, a silicone resin composite, a modified epoxy resin composite such as a silicone-modified epoxy resin, a modified silicone resin composite such as an epoxy-modified silicone resin, an unsaturated polyester resin, a saturated polyester resin, a polyimide resin composite, or a modified polyimide resin composite, polyphthalamide (PPA), polycarbonate resins, polyphenylene sulfide (PPS), liquid crystal polymers (LCP), ABS resins, phenol resins, acrylic resins, and PBT resins. In particular, a thermosetting resin such as an epoxy resin composite or a modified silicone resin composite is preferably used. The first resin portion 31, the second resin portion 32, the third resin portion 33, and the fourth resin portion 34 are integrally connected to each other, and accordingly can be made of the same resin material. The resin body 30 preferably contains a light-reflective substance in the base material. With this structure, the resin body 30 has light-reflective property, so that light emitted from the light emitting element can be reflected upward efficiently. For the light-reflective substance, for example, titanium oxide, zinc oxide, silicon oxide, zirconium oxide, aluminum oxide, aluminum nitride, or the like can be used.

For the resin body 30, a material with a low light reflectance with respect to light from outside of the light emitting device (e.g., in many cases, sunlight) may be used in order to increase contrast of the light emitting device. In this case, it is generally preferable that a color of the resin body 30 is black or a color similar to black. When using the resin body 30 of such a color, a carbon such as acetylene black, activated carbon, or graphite, a transition metal oxide such as iron oxide, manganese dioxide, cobalt oxide, or molybdenum oxide, or a colored organic pigment can be used for a filler in the resin body 30 according to the purpose.

Light Emitting Device

With reference to FIGS. 5A to 8C, light emitting devices 100, 101, and 102 in the present disclosure will be described. In each of FIGS. 5A, 6A, and 7A, a sealing member is transparently illustrated in order to show the structure inward of the sealing member.

Figure 5A:
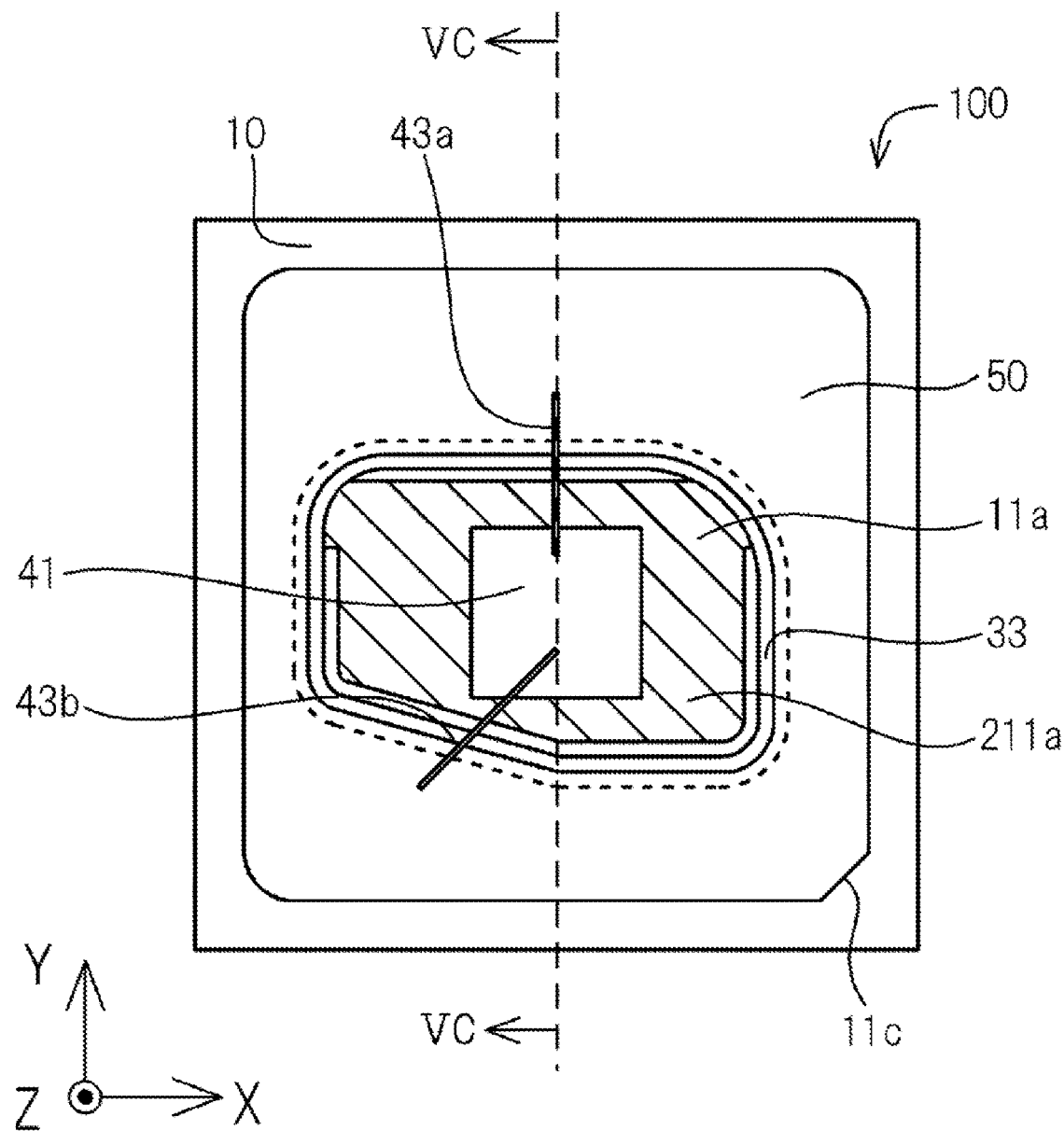
FIG. 5A is a schematic top view of a light emitting device according to one embodiment.
Figure 5B:
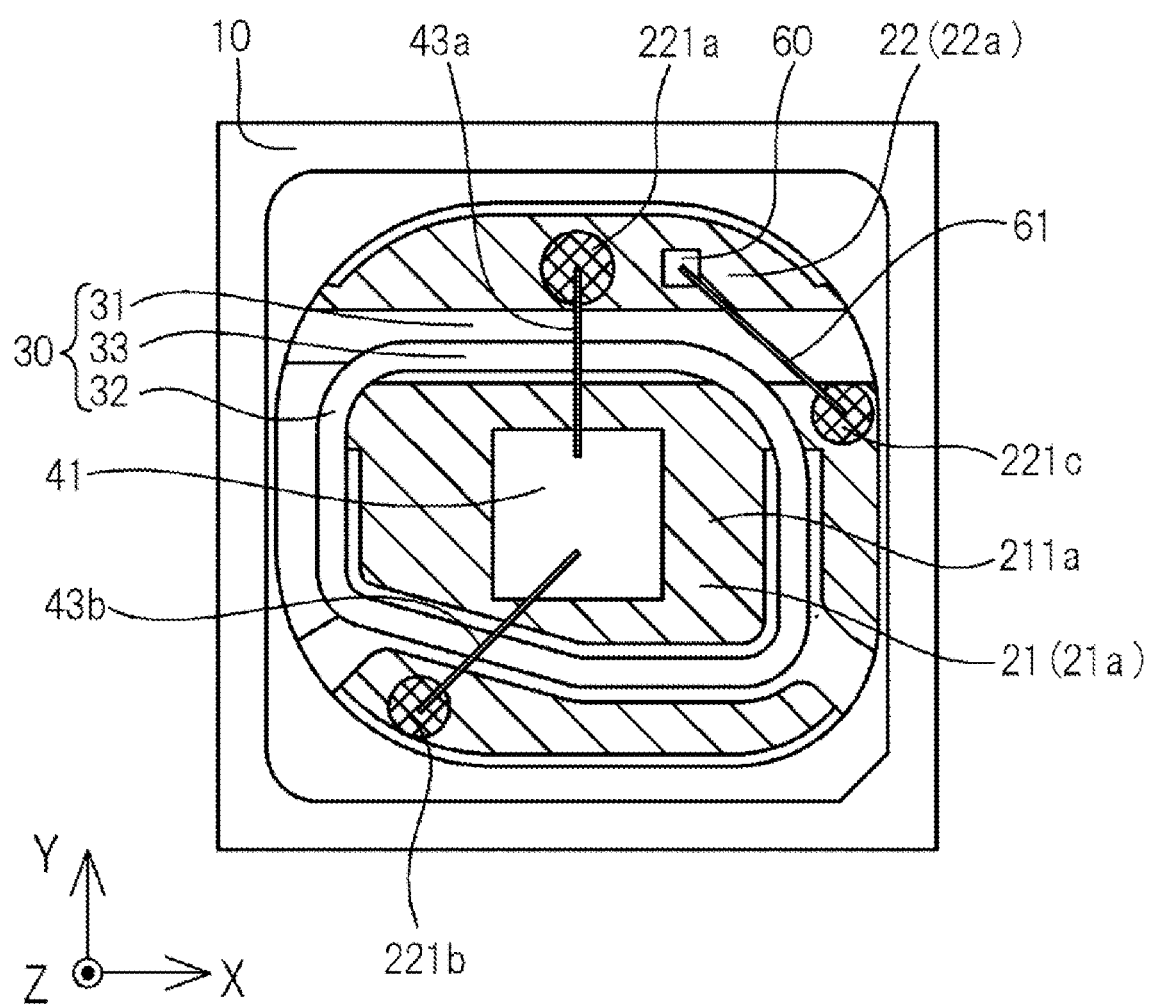
FIG. 5B is a schematic top view of the light emitting device according to one embodiment, in which illustration of a resin member is omitted.
Figure 5C:
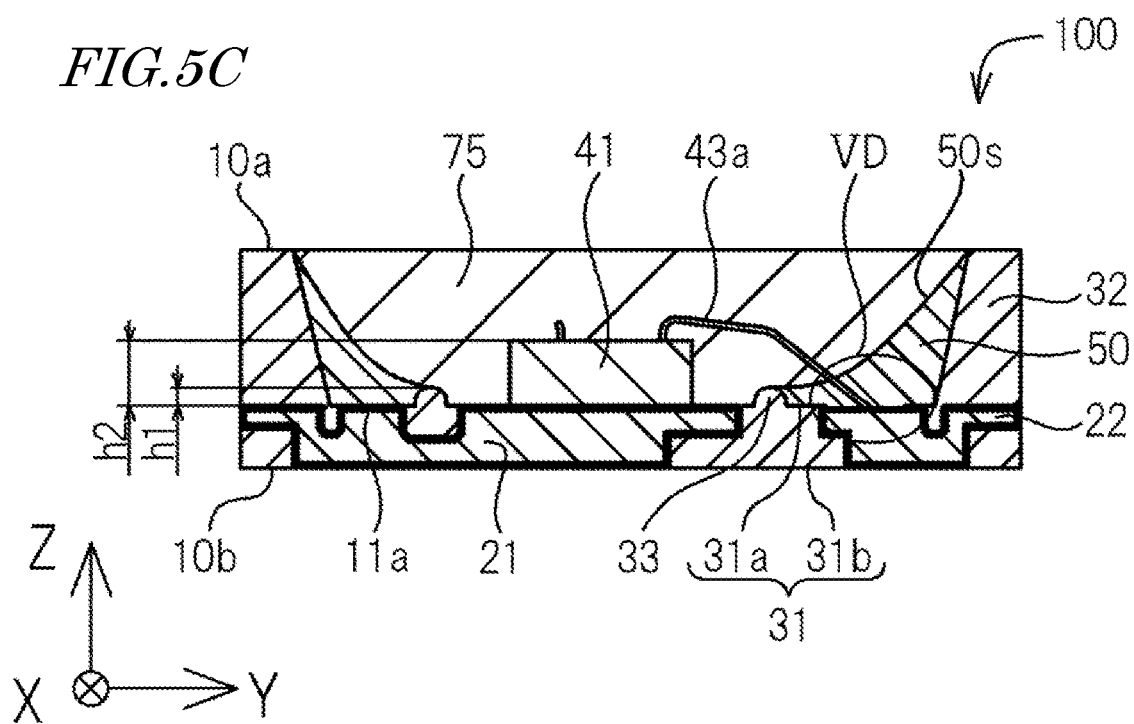
FIG. 5C is a schematic cross-sectional end view of the light emitting device in FIG. 5A taken along line VC-VC in FIG. 5A.
Figure 5D:
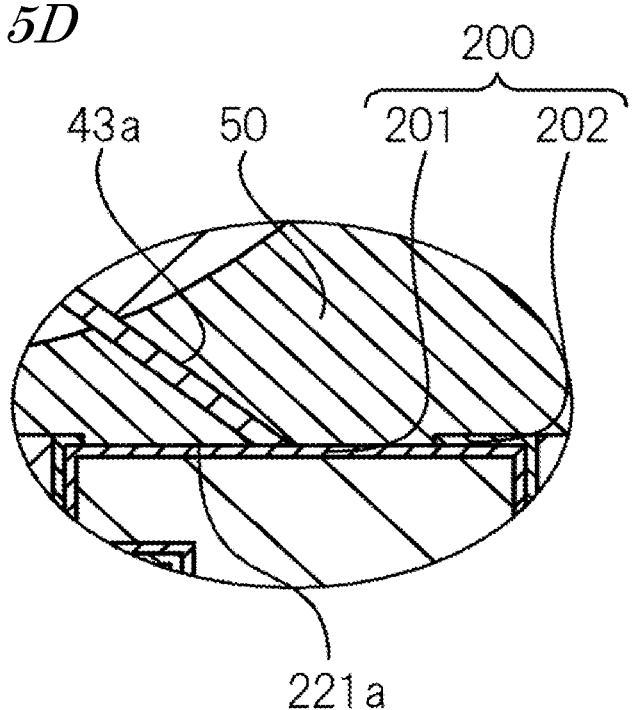
FIG. 5D is a schematic enlarged view of a region indicated by VD in FIG. 5C.

As shown in FIG. 5A and FIG. 5C, the light emitting device 100 includes the resin package 10, a light emitting element 41, a wire 43*a*, and a resin member 50. The light emitting device 100 includes the resin package 10 described above. The light emitting element 41 is disposed on the element-mounting region 211*a* of the first lead 21. The wire 43*a* electrically connects the wire-connecting region 221*a* and the light emitting element 41. As shown in FIG. 5D, the resin member 50 is in contact with the wire-connecting region 221*a* and the second plating 202. Accordingly, the contact area between the resin member 50 and the resin package 10 is increased, so that a light emitting device in which adhesion between the resin member 50 and the resin package 10 is increased can be obtained.

The second plating 202 has a reflectance for the peak emission wavelength of the light emitting element 41 greater than a reflectance of the first plating 201 for the peak emission wavelength of the light emitting element 41. The second plating 202 includes a portion located in the element-mounting region 211*a*, and accordingly high reflectance of the second plating 202 allows for increasing light extraction efficiency of the light emitting device 100.

Light Emitting Element 41

For the light emitting element 41, a semiconductor light emitting element such as a light emitting diode element can be used. While the light emitting device 100 in the present embodiment includes a single light emitting element 41, the light emitting device 100 may include two or more light emitting elements 41. In particular, the light emitting element 41 preferably includes a nitride semiconductor configured to emit light in range of the ultraviolet region to the visible-light region ($In_XAl_YGa_{1-X-Y}N$, $0 \le X$, $0 \le Y$, $X+Y \le 1$). For example, light emitting elements 41 configured to emit blue light and green light may be used. For example, when the light emitting device 100 includes three light emitting elements 41, the three light emitting elements 41 may be configured to emit blue light, green light, and red light. The plurality of light emitting elements 41 may be electrically connected in series or in parallel. Alternatively, the plurality of light emitting elements 41 may be electrically connected in combination of series connection and parallel connection.

As shown in FIG. 5C, the light emitting element 41 preferably has a height h2 greater than the height h1 of the third resin portion 33. With such a height, light emitted from of the light emitting element 41 is not easily shielded by the third resin portion 33, so that light extraction efficiency of the light emitting device 100 can be increased. The "height h2 of the light emitting element 41" as used herein refers to a distance in the Z-direction between the upward-facing surface 11*a* defining the recess 11 of the resin package 10 and an upper surface of the light emitting element 41.

The light emitting element 41 is disposed on the element-mounting region 211*a* of the first lead 21, and is bonded to the first lead 21 via a bonding member. Examples of a material of the bonding member include resins containing resin materials having described in description of examples of a resin material used for the resin body 30, solders such as tin-bismuth-based solders, tin-copper-based solders, tin-silver-based solders, and gold-tin-based solders, conductive pastes of silver, gold, palladium, etc., bumps, anisotropic conductive materials, and brazing materials of low-meltingpoint metals, and the like. In the present embodiment, the light emitting element 41 is electrically connected with the first lead 21 and the second lead 22 via the wire 43a and a wire 43b, respectively.

The light emitting element 41 may be in contact with a portion of the resin member 50 in contact with the wire connecting region 221a and the second plating 202, or may be spaced apart from the resin member 50 as shown in FIG. 5C. For example, when the resin member 50 covers the upper surface of the light emitting element 41, the resin member 50 is preferably light-transmissive. With the light-transmissive resin member 50, light emitted from the light emitting element 41 can be easily extracted to the outside. With the resin member 50 covering the upper surface of the light emitting element 41, the light emitting element 41 can be protected by the resin member 50 from an external force, dust, moisture, and the like. When the light emitting element 41 and the resin member 50 do not overlap each other in a top view as shown in FIG. 5A, the resin member 50 may be light-transmissive or light-reflective. When the light emitting element 41 and the resin member 50 do not overlap each other in a top view, the resin member 50 preferably contains a light-reflective substance. With such a structure, light emitted from the light emitting element 41 is reflected by the light-reflective substance, which allows for reducing deterioration of the resin member 50 due to light.

Resin Member 50

The resin member 50 is in contact with the wire-connecting region 221a and the second plating 202. Accordingly, the contact area between the resin member 50 and the resin package 10 is increased, so that adhesion between the resin member 50 and the resin package 10 can be increased. Further, the resin member 50 covers at least a portion of the wire 43a. The resin member 50 can protect the wire 43a from an external force, dust, moisture, and the like.

As shown in FIG. 5C, the resin member 50 continuously covers at least a portion of the inner lateral wall surfaces of the second resin portion 32 and a portion of the upward-facing surface 11a defining the recess 11. Further, the resin member 50 preferably includes an inclined surface 50s spreading from the upward-facing surface 11a side of the recess 11 toward the opening 11c. When the resin member 50 has light-reflective property, light emitted from the light emitting element 41 can be reflected by the inclined surface 50s toward the opening 11c. This allows for improving light extraction efficiency of the light emitting device 100. The inclined surface 50s of the resin member 50 may include a flat surface, a concave-curved surface, and/or a convex-curved surface. In other words, in a cross-sectional view, the inclined surface 50s of the resin member 50 may include a straight line, a concave-curved line, and/or a convex-curved line. As shown in FIG. 5C, in a cross-sectional view, the inclined surface 50s of the resin member 50 is preferably a concave-curved line recessed toward the upward-facing surface 11a defining the recess 11. With this arrangement, light emitted from the light emitting element 41 can be reflected by the resin member 50, which allows for reducing absorption of light, emitted from the light emitting element 41, into the light emitting element 41.

As shown in FIG. 5C, it is preferable that the resin member 50 continuously covers the second resin portion 32 and the third resin portion 33. This structure allows for increasing adhesion between the resin member 50 and the resin package 10.

Figure 6A:
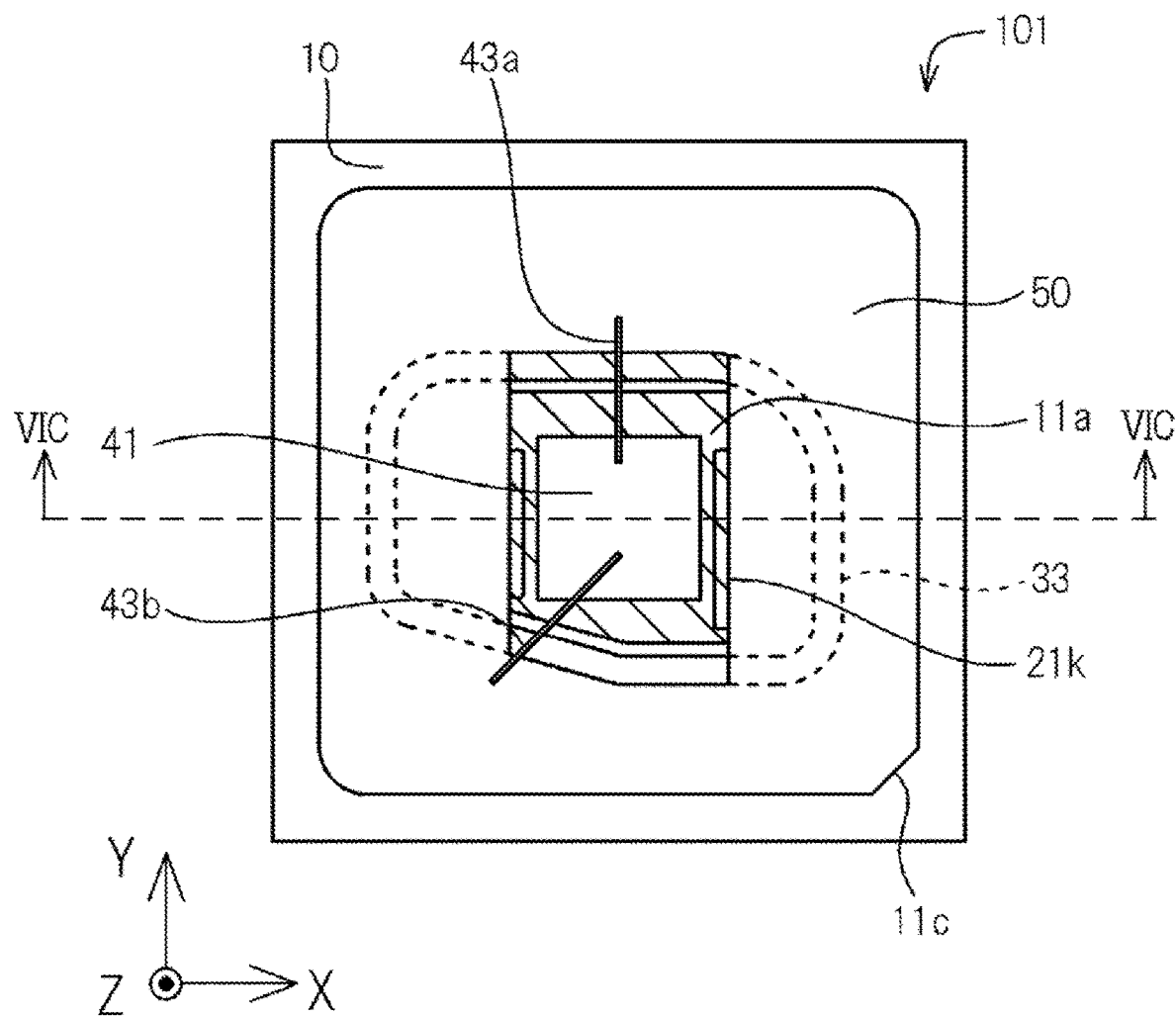
FIG. 6A is a schematic top view showing a first variant example of the light emitting device according to one embodiment.

The resin member 50 may be spaced apart from a portion of the upward-facing surface 11a defining the recess 11 located between the third resin portion 33 and the light emitting element 41 as shown in FIG. 5A, or may be in contact with a portion of the upward-facing surface 11a defining the recess 11 located between the third resin portion 33 and the light emitting element 41 as shown in FIG. 6A. With the resin member 50 spaced apart from a portion of the upward-facing surface 11a defining the recess 11 located between the third resin portion 33 and the light emitting element 41, the resin member 50 and the light emitting element 41 can be prevented from being in contact with each other. When the resin member 50 is light-reflective, with the resin member 50 and the light emitting element 41 spaced apart from each other, light emitted from the light emitting element 41 can be reflected at the resin member 50, which allows for reducing absorption of light into the light emitting element 41. With the resin member 50 in contact with a portion of the upward-facing surface 11a defining the recess 11 located between the third resin portion 33 and the light emitting element 41, the resin member 50 can be formed to a location near the light emitting element 41. When the resin member 50 is light-reflective, such a structure allows for facilitating reflection of light emitted from the light emitting element 41 by the resin member 50, so that light extraction efficiency of the light emitting device 100 can be increased.

Figure 6B:
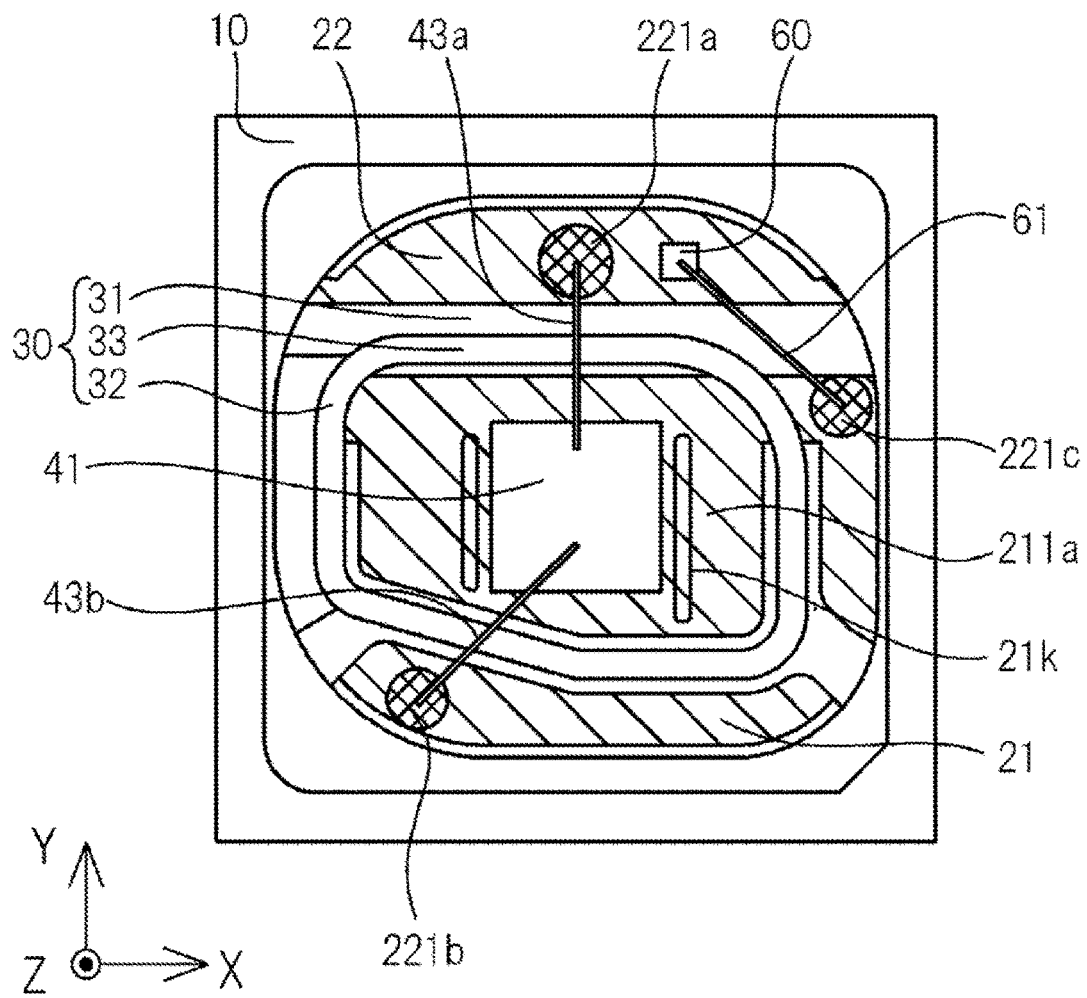
FIG. 6B is a schematic top view showing the first variant example of the light emitting device according to one embodiment, in which illustration of a resin member is omitted.
Figure 6C:
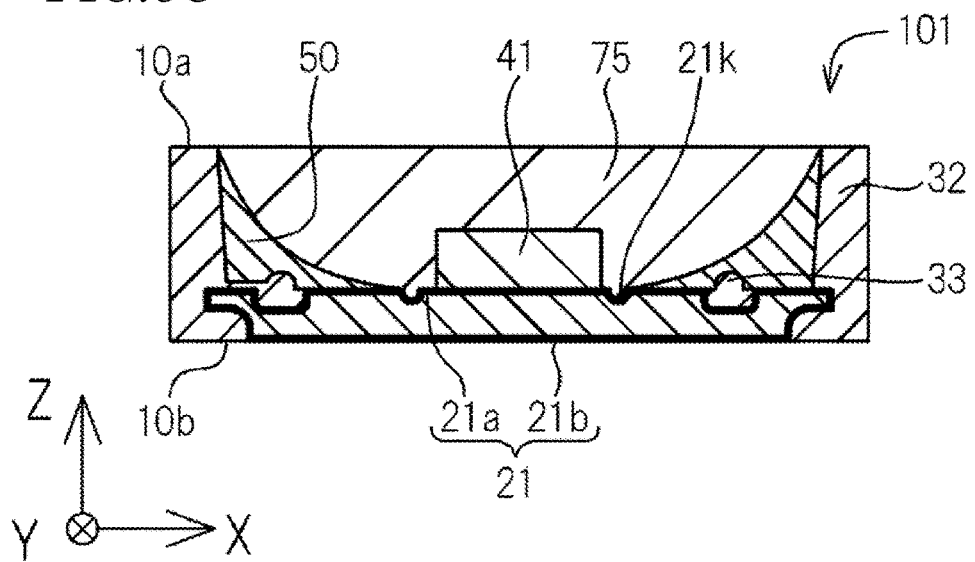
FIG. 6C is a schematic cross-sectional end view of the light emitting device according to one embodiment taken along line VIC-VIC in FIG. 6A.

As shown in FIGS. 6A, 6B, and 6C, fifth grooves 21k are preferably formed between the third resin portion 33 and the light emitting element 41, such that the resin member 50 is spaced apart from the light emitting element 41 and is in contact with a portion of the upward-facing surface 11a defining the recess 11 located between the third resin portion 33 and the light emitting element 41. With this structure, the resin member 50 can be stemmed by the fifth grooves 21k.

Figure 7A:
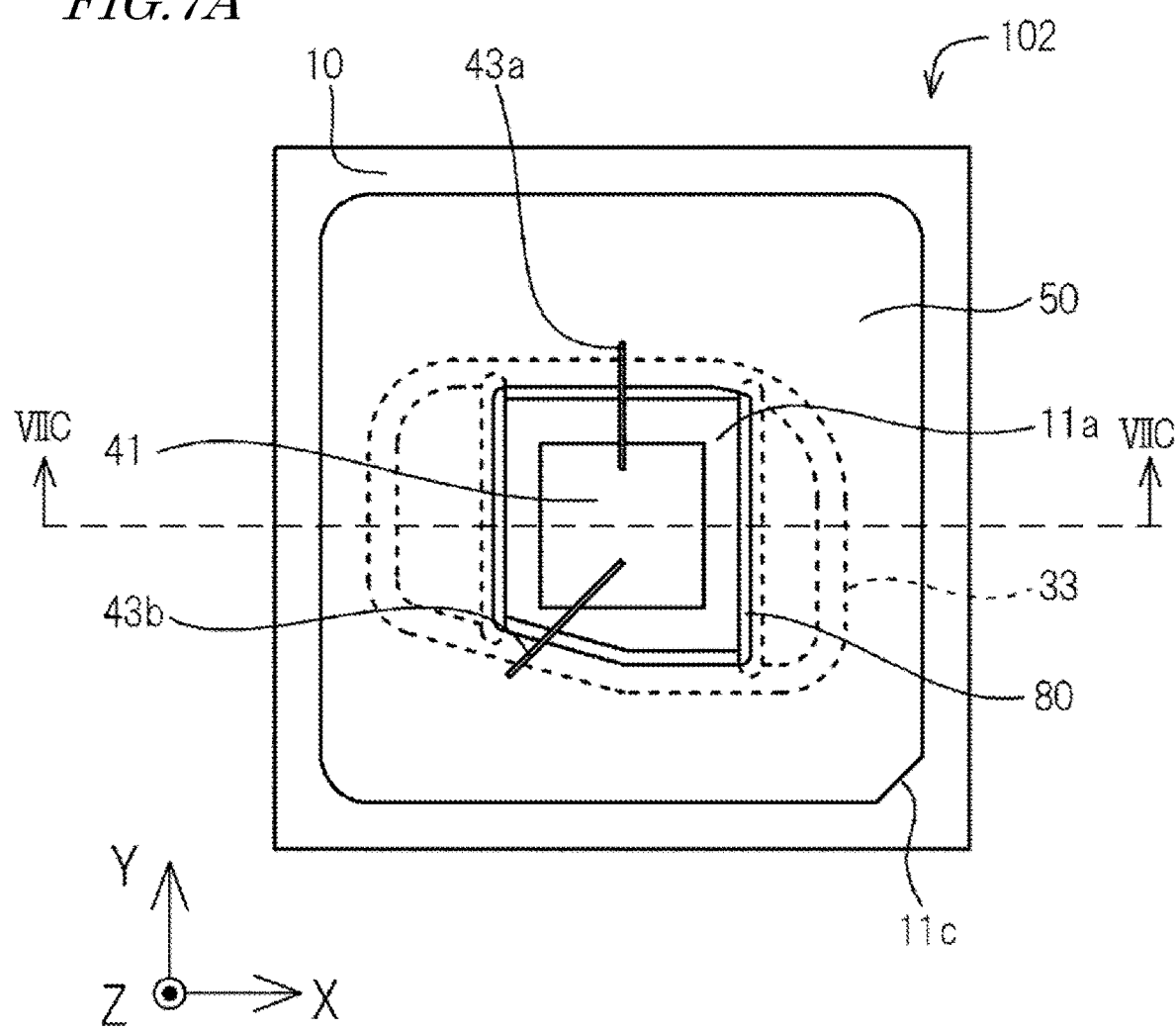
FIG. 7A is a schematic top view showing a second variant example of the light emitting device according to one embodiment.
Figure 7B:
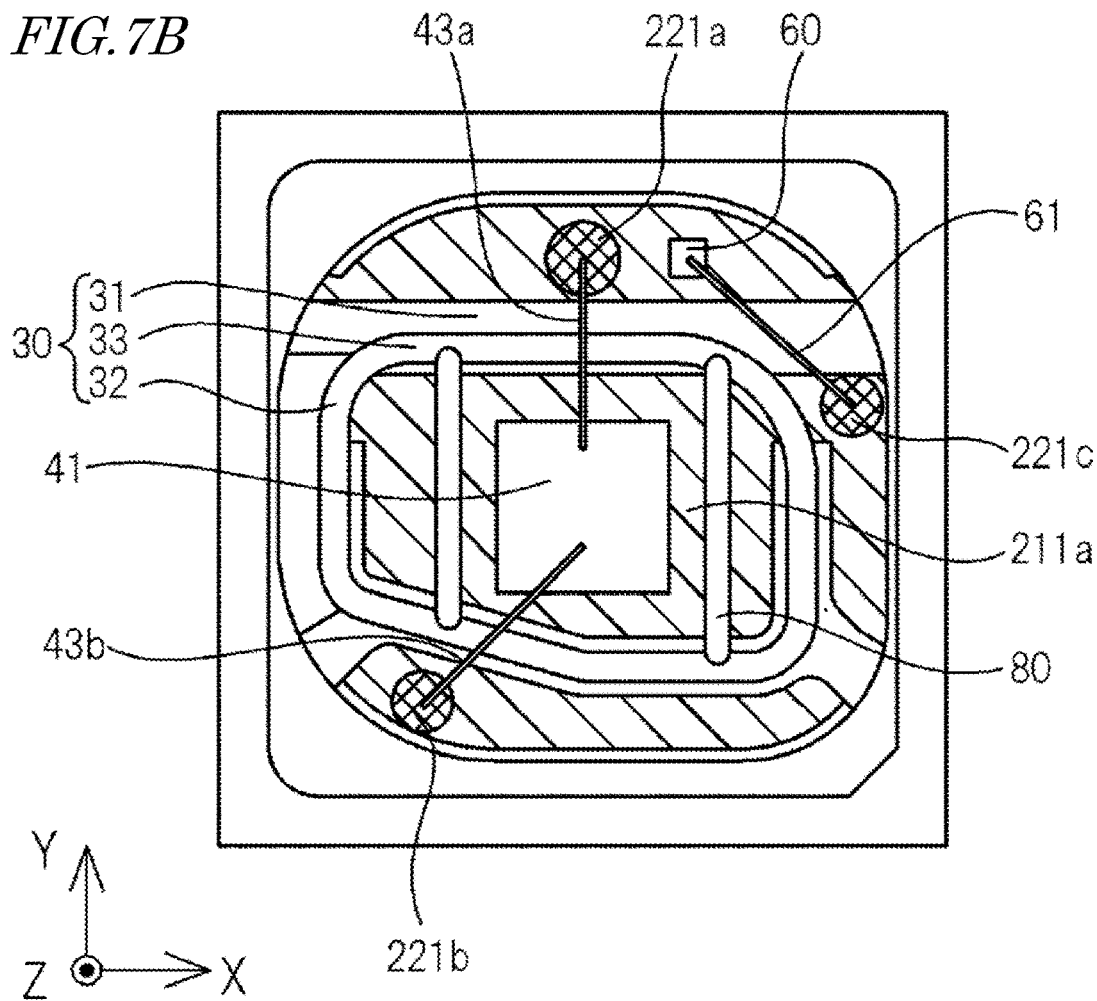
FIG. 7B is a schematic top view showing the second variant example of the light emitting device according to one embodiment, in which illustration of a resin member is omitted.
Figure 7C:
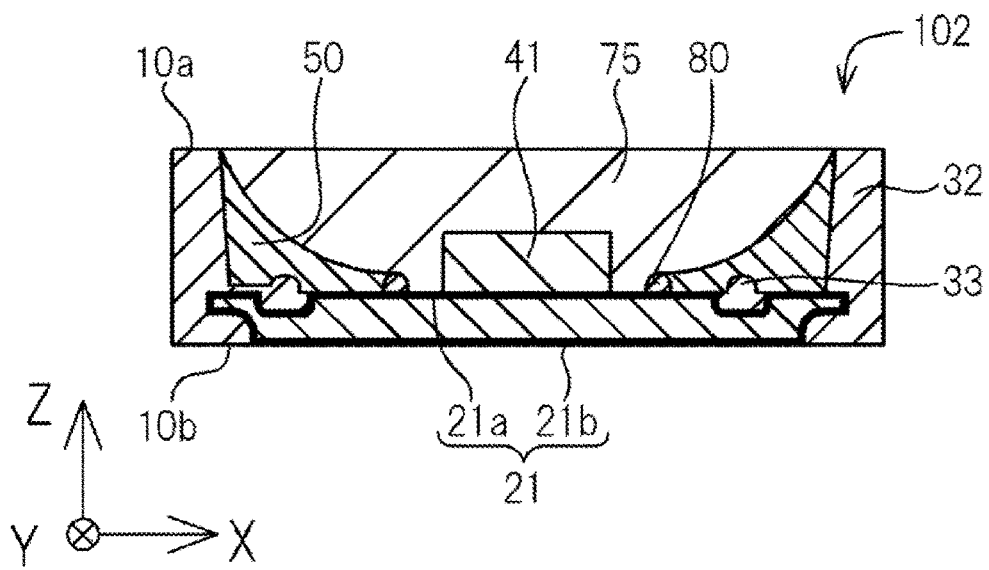
FIG. 7C is a schematic cross-sectional end view of the light emitting device in FIG. 7A taken along line VIIC-VIIC in FIG. 7A.

As shown in FIGS. 7A, 7B, and 7C, resin dams 80 are preferably disposed between the third resin portion 33 and the light emitting element 41, such that the resin member 50 is spaced apart from the light emitting element 41 and is in contact with a portion of the upward-facing surface 11a defining the recess 11 located between the third resin portion 33 and the light emitting element 41. With this structure, the resin member 50 can be stemmed by the resin dams 80.

For the resin member 50, a thermosetting resin, a thermoplastic resin, or the like may be used, and more specific examples of such resin include a phenol resin, an epoxy resin, a BT resin, a PPA, and a silicone resin. The resin member 50 may contain a light-reflective substance. For the light-reflective substance in the resin member 50, a material similar to a material of the light-reflective substance in the resin body 30 can be used. With the light-reflective substance dispersed in the resin member 50, light emitted from the light emitting element 41 can be efficiently reflected. For the resin dams 80, a material similar to a material used for the resin member 50 can be used.

The resin member 50 preferably has a light reflectance higher than a light reflectance of the resin body 30. For example, a content of the light reflective substance (e.g., a titanium oxide) contained in the resin member 50 is greater than a content of the light reflective substance contained in the resin body 30. In this case, a content of the light-reflective substance contained in the second resin member 50 is 1.5 times or greater, more preferably 2 times or greater, further more preferably 2.5 times or greater as much as a content of the light-reflective substance contained in the resin body 30. For example, the resin member 50 contains 40 weight % of titanium oxide with respect to a total weight of an unhardened resin material of the resin member 50, and the resin body 30 contains 15 to 20 weight % of titanium oxide with respect to a total weight of an unhardened resin material of the resin body 30.

Figure 8A:
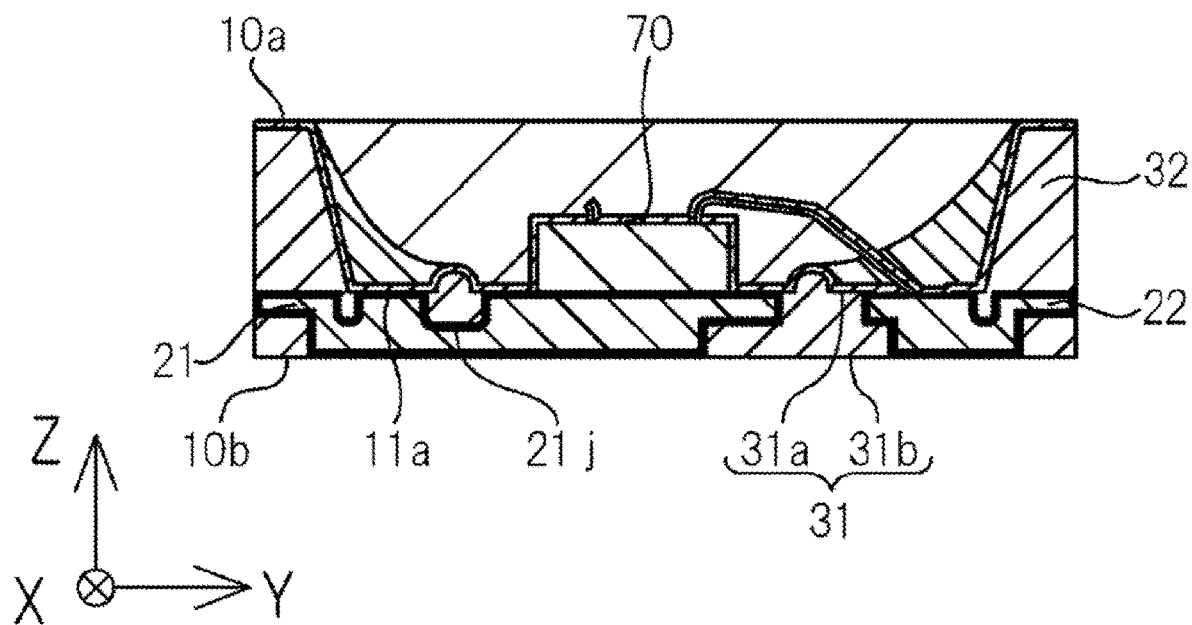
FIG. 8A is a schematic cross-sectional end view showing a third variant example of the light emitting device according to one embodiment.
Figure 8B:
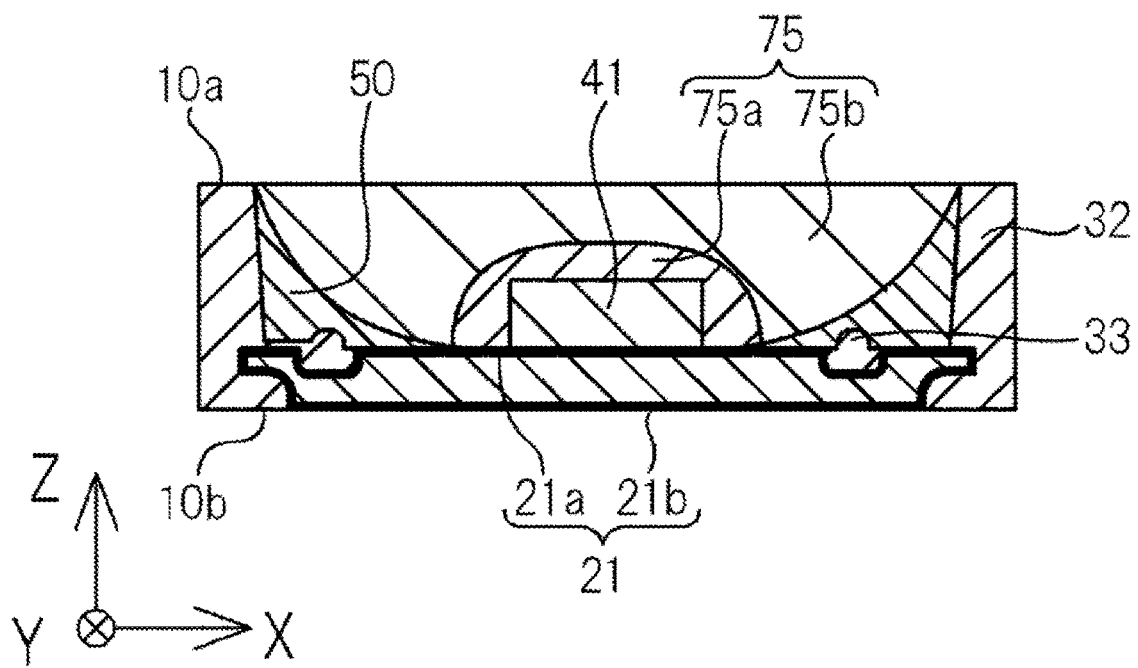
FIG. 8B is a schematic cross-sectional end view showing a fourth variant example of the light emitting device according to one embodiment.

When the second plating 202 is made of at least one selected from Ag and Ag alloy, a protective layer made of silicon oxide, aluminum oxide, or the like may be disposed on a surface of the second plating 202. This structure allows for inhibiting discoloration of the second plating 202 caused by sulfur components in the air. The protective layer can be disposed using, for example, a vacuum process such as a sputtering, or using other known techniques. The protective layer may be disposed after mounting of the light emitting element 41, connecting using the wires, and disposing of the resin member 50 are performed. Alternatively, as shown in FIG. 8A, the protective layer 70 may be formed after mounting of the light emitting element 41 and connecting using the wires are performed and before the resin member 50 is disposed. As shown in FIG. 8A, a protective layer 70 may cover the light emitting element 41 and at least a portion of the upward-facing surface 11a defining the recess 11.

Protective Element 60

The light emitting device according to certain embodiments may include a protective element 60 to improve electrostatic resistance. For the protective element 60, various protective elements for being mounted in general light emitting devices can be employed. For example, a Zener diode can be used for the protective element 60. In the light emitting device according to certain embodiments, the protective element 60 and the light emitting element 41 are electrically connected in parallel.

As shown in FIG. 5B, the protective element 60 is disposed on the upper surface 22a of the second lead 22. When the resin member 50 is light-reflective, the protective element 60 is preferably embedded in the resin member 50. With such a structure, absorption of light from the light emitting element 41 into the protective element 60 can be reduced.

One of two terminals of the protective element 60 is electrically connected to the upper surface 22a of the second lead 22 via a bonding member. Examples of a material of the bonding member include solders such as tin-bismuth-based solders, tin-copper-based solders, tin-silver-based solders, and gold-tin-based solders, conductive pastes of silver, gold, palladium, etc., bumps, anisotropic conductive materials, and brazing materials of low-melting-point metals, and the like. Further, the other of the two terminals of the protective element 60 is electrically connected to the upper surface 21a of the first lead 21 via a wire 61. Further, in a top view, it is preferable that a wire-connecting region connected to the upper surface 21a of the first lead 21 via the wire 61 is also located inward of the second plating 202, which has the outermost surface located higher than the outermost surface of the first plating 201, in a lateral direction along the third resin portion 33 as shown in FIG. 1A. This structure allows for increasing adhesion between the resin package and the resin member 50 in contact with the wire-connecting region.

As shown in FIG. 5C, the light emitting device 100 may include a sealing member 75 covering the upper surface of the light emitting element 41. The sealing member 75 is disposed in a recess defined by the inclined surface 50s of the resin member 50 in the recess 11, and covers the light emitting element 41 disposed on the upward-facing surface 11a defining the recess 11. The sealing member 75 can protect the light emitting element 41 from an external force, dust, moisture, and the like.

The sealing member 75 preferably transmits 60% or more, further preferably 90% or more of light emitted from the light emitting element 41. For a material of the sealing member 75, a resin material used for the resin body 30 can be used. Examples of a resin used for a base material of the sealing member 75 include thermosetting resins and thermoplastic resins, such as a silicone resin, an epoxy resin, an acrylic resin, and a resin containing one or more of these. The sealing member 75 may have a single layer structure or may have a layered structure of a plurality of layers. Further, light-scattering particles of titanium oxide, silicon oxide, zirconium oxide, aluminum oxide, etc., can be dispersed in the sealing member 75.

The sealing member 75 may contain a material for converting wavelength of light emitted from the light emitting element 41 (for example, a fluorescent material). Specific examples of the fluorescent material include an yttrium aluminum garnet activated with cerium, a lutetium aluminum garnet activated with cerium, a nitrogen-containing calcium aluminosilicate activated with europium and/or chromium (in which a portion of calcium can be substituted by strontium), a sialon activated with europium, a silicate activated with europium, a strontium aluminate activated with europium, and a potassium fluosilicate activated with manganese. For example, a content of the light scattering particles and/or the fluorescent material is preferably in a range of about 10 to 100 weight % with respect to the total weight of the sealing member 75. When the resin member 50 covers the upper surface of the light emitting element 41, the resin member 50 may contain a material for converting wavelength of light emitted from the light emitting element 41 (for example, a fluorescent material). For a fluorescent material contained in the resin member 50, a material similar to a material used for the fluorescent material contained in the sealing member 75 can be used.

The sealing member 75 may include a plurality of sealing portions. For example, the sealing member 75 may include a first sealing portion 75a and a second sealing portion 75b in a configuration shown in FIG. 8B. The first sealing portion 75a covers the upper surface and the lateral surfaces of the light emitting element 41. The second sealing portion 75b is disposed on the first sealing portion 75a. In the sealing member 75, for example, the first sealing portion 75a can contain a fluorescent material adapted to emit light of a long wavelength, and the second sealing portion 75b can contain a fluorescent material adapted to emit light of a short wavelength. With this structure, absorption of light emitted from the fluorescent material contained in the first sealing portion 75a or the fluorescent material contained in the second sealing portion 75b into the fluorescent material contained in the first sealing portion 75a or the fluorescent material contained in the second sealing portion 75b can be reduced. For example, the first sealing portion 75a contains a red fluorescent material, and the second sealing portion 75b contains a yellow fluorescent material, a green fluorescent material, and/or a blue fluorescent material.

Figure 8C:
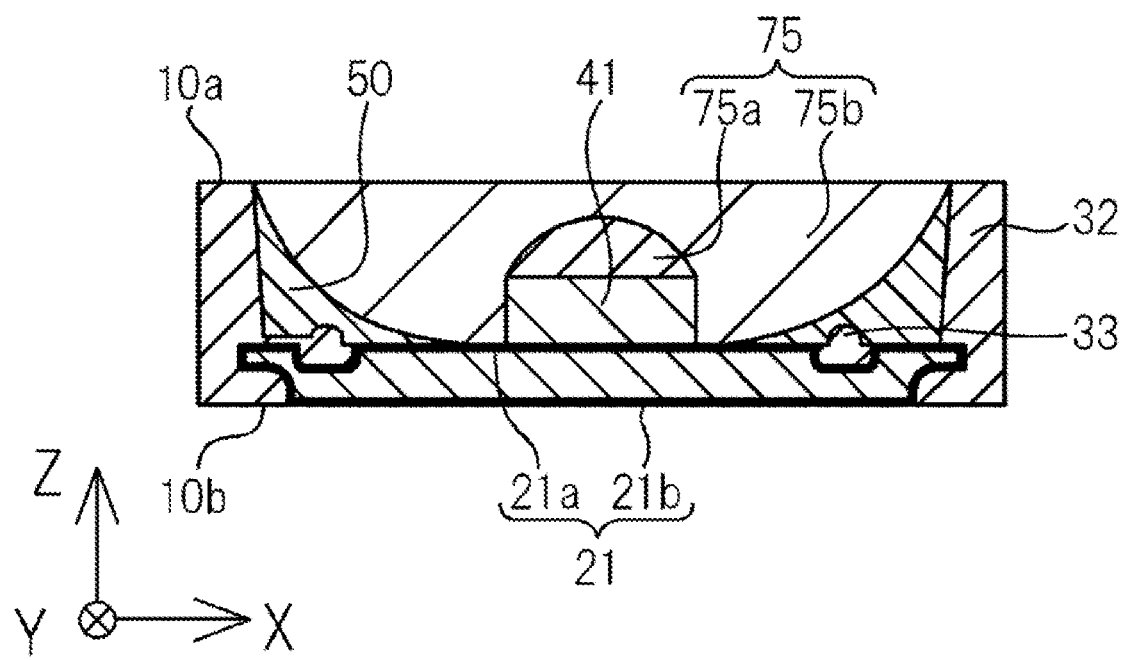
FIG. 8C is a schematic cross-sectional end view showing a fifth variant example of the light emitting device according to one embodiment.

The sealing member 75 may include the first sealing portion 75a and the second sealing portion 75b in a configuration shown in FIG. 8C. The first sealing portion 75a covers the upper surface of the light emitting element 41, and does not cover the lateral surfaces of the light emitting element 41. The second sealing portion 75b is disposed on the first sealing portion 75a, and covers an upper surface of the first sealing portion 75a and the lateral surfaces of the light emitting element 41. In the sealing member 75, for example, the first sealing portion 75a contains a fluorescent material adapted to emit light of a long wavelength, and the second sealing portion 75b contains a fluorescent material adapted to emit light of a short wavelength. When the fluorescent material adapted to emit light of a long wavelength is disposed on the upper surface (light emission surface) side of the light emitting element 41 that has a great optical intensity, a large portion of light emitted from the light emitting element 41 can be efficiently absorbed by the fluorescent material adapted to emit light of a longer wavelength. Accordingly, absorption of light emitted from the fluorescent material contained in the first sealing portion 75a or the fluorescent material contained in the second sealing portion 75b into the fluorescent material contained in the first sealing portion 75a or the fluorescent material contained in the second sealing portion 75b can be reduced. For example, the first sealing portion 75a contains a red fluorescent material, and the second sealing portion 75b contains a yellow fluorescent material, a green fluorescent material, and/or a blue fluorescent material.

The light emitting device according to certain embodiments of the present invention can be used for various illuminating devices, backlight devices for liquid crystal display devices, large-sized display devices, various display devices for advertising, destination guiding, etc., a projector, a digital video camera, image reading apparatus for a facsimile machine, a copying machine, a scanner, or the like, etc.

It is to be understood that, although certain embodiments of the present invention have been described, various other embodiments and variants may occur to those skilled in the art that are within the scope and spirit of the invention, and such other embodiments and variants are intended to be covered by the following claims.

What is claimed is:

1. A resin package comprising:
   a first lead comprising an element-mounting region;
   a second lead comprising a wire-connecting region; and
   a resin body comprising a first resin portion, a second resin portion, and a third resin portion;
   wherein a recess is defined by:
      an upward-facing surface that includes the element-mounting region, the wire-connecting region, and an upper surface of the first resin portion, and
      an inner lateral surface of the second resin portion,
   wherein the third resin portion is located above the upward-facing surface, surrounds the element-mounting region, and is spaced apart from the inner lateral surface of the second resin portion,
   wherein the wire-connecting region is located outward of the third resin portion,
   wherein each of the first and second leads comprises a plating located at surfaces of each of the first and second leads, each plating comprising a first plating and a second plating,
   wherein the second plating of the first lead covers at least a portion of the first plating of the first lead,
   wherein the second plating of the second lead covers a portion of the first plating of the second lead,
   wherein the wire-connecting region is located on a portion of an outermost surface of the first plating of the second lead that is exposed at the upward-facing surface defining the recess,
   wherein the element-mounting region is located on a portion of an outermost surface of the second plating of the first lead that is exposed at the upward-facing surface defining the recess,
   wherein each first plating is made of at least one selected from Au, Au alloy, Pd, and Pd alloy, and
   wherein, in a top view, the wire-connecting region is located laterally inward of a portion of the second plating of the second lead that has an outermost surface located higher than the portion of the outermost surface of the first plating of the second lead on which the wire-connecting region is located.

2. The resin package according to claim 1, wherein each second plating is made of Ag and/or Ag alloy.

3. The resin package according to claim 1, wherein both the first plating of the second lead and the second plating of the second lead are in contact with the resin body.

4. The resin package according to claim 2, wherein both the first plating of the second lead and the second plating of the second lead are in contact with the resin body.

5. The resin package according to claim 1, wherein a portion of the first plating of the first lead in a region surrounded by the third resin portion in a top view is entirely covered by the second plating of the first lead.

6. The resin package according to claim 2, wherein a portion of the first plating of the first lead in a region surrounded by the third resin portion in a top view is entirely covered by the second plating of the first lead.

7. The resin package according to claim 3, wherein a portion of the first plating of the first lead in a region surrounded by the third resin portion in a top view is entirely covered by the second plating of the first lead.

8. A light emitting device comprising:
   a resin package comprising:
      a first lead comprising an element-mounting region;
      a second lead comprising a wire-connecting region; and
      a resin body comprising a first resin portion, a second resin portion, and a third resin portion;
      wherein a recess is defined by:
         an upward-facing surface that includes the element-mounting region, the wire-connecting region, and an upper surface of the first resin portion, and
         an inner lateral surface of the second resin portion,
      wherein the third resin portion is located above the upward-facing surface, surrounds the element-mounting region, and is spaced apart from the inner lateral surface of the second resin portion,
      wherein the wire-connecting region is located outward of the third resin portion,
      wherein each of the first and second leads comprises a plating located at surfaces of each of the first and second leads, each plating comprising a first plating and a second plating,
      wherein the second plating of the first lead covers at least a portion of the first plating of the first lead,
      wherein the second plating of the second lead covers a portion of the first plating of the second lead,
      wherein the wire-connecting region is located on a portion of an outermost surface of the first plating of the second lead that is exposed at the upward-facing surface defining the recess,
      wherein the element-mounting region is located on a portion of an outermost surface of the second plating of the first lead that is exposed at the upward-facing surface defining the recess,
      wherein each first plating is made of at least one selected from Au, Au alloy, Pd, and Pd alloy, and
      wherein, in a top view, the wire-connecting region is located laterally inward of a portion of the second plating of the second lead that has an outermost surface located higher than the portion of the outermost surface of the first plating of the second lead on which the wire-connecting region is located;
   a light emitting element mounted in the element-mounting region;
   a wire that connects the wire connecting region to the light emitting element; and a resin member that contacts the wire-connecting region and the second plating of each of the first lead and the second lead.

9. The light emitting device according to claim 8, wherein a reflectance of each second plating for a peak emission wavelength of the light emitting element is greater than a reflectance of each first plating for the peak emission wavelength of the light emitting element.

10. The light emitting device according to claim 8, wherein the second plating of each of the first lead and the second lead is made of Ag and/or Ag alloy.

11. The light emitting device according to claim 9, wherein the second plating of each of the first lead and the second lead is made of Ag and/or Ag alloy.

12. The light emitting device according to claim 8, wherein both the first plating of the second lead and the second plating of the second lead are in contact with the resin body.

13. The light emitting device according to claim 9, wherein both the first plating of the second lead and the second plating of the second lead are in contact with the resin body.

14. The light emitting device according to claim 10, wherein both the first plating of the second lead and the second plating of the second lead are in contact with the resin body.

15. The light emitting device according to claim 8, wherein a portion of the first plating of the first lead in a region surrounded by the third resin portion in a top view is entirely covered by the second plating of the first lead.

16. The light emitting device according to claim 9, wherein a portion of the first plating of the first lead in a region surrounded by the third resin portion in a top view is entirely covered by the second plating of the first lead.

17. The light emitting device according to claim 8, wherein the resin member contains a light-reflective substance.

18. The light emitting device according to claim 9, wherein the resin member contains a light-reflective substance.

19. The light emitting device according to claim 8, further comprising a protective layer covering the light emitting element and at least a portion of the upward-facing surface defining the recess.

20. The light emitting device according to claim 9, further comprising a protective layer covering the light emitting element and at least a portion of the upward-facing surface defining the recess.

* * * * *